(12) United States Patent
Ma

(10) Patent No.: US 9,003,254 B2
(45) Date of Patent: Apr. 7, 2015

(54) METHODS AND SYSTEMS FOR TESTING ELECTRONIC CIRCUITS

(71) Applicant: Ssu-Pin Ma, San Jose, CA (US)

(72) Inventor: Ssu-Pin Ma, San Jose, CA (US)

( * ) Notice: Subject to any disclaimer, the term of this patent is extended or adjusted under 35 U.S.C. 154(b) by 0 days.

(21) Appl. No.: 14/181,709

(22) Filed: Feb. 16, 2014

(65) Prior Publication Data

US 2014/0195870 A1 Jul. 10, 2014

Related U.S. Application Data

(63) Continuation-in-part of application No. 12/766,886, filed on Apr. 25, 2010, now Pat. No. 8,694,845.

(51) Int. Cl.
*G01R 31/28* (2006.01)
*G06F 11/26* (2006.01)
*G11C 29/56* (2006.01)
*G01R 31/3193* (2006.01)

(52) U.S. Cl.
CPC .............. *G06F 11/26* (2013.01); *G11C 29/56* (2013.01); *G01R 31/31932* (2013.01); *G01R 31/2843* (2013.01)

(58) Field of Classification Search
CPC ................. G01R 31/2843; G01R 31/31932; G01R 31/2844
See application file for complete search history.

(56) References Cited

U.S. PATENT DOCUMENTS

| | | | | |
|---|---|---|---|---|
| 6,816,422 B2 * | 11/2004 | Hamade et al. | | 365/201 |
| 2003/0210594 A1 * | 11/2003 | Hamade et al. | | 365/201 |
| 2006/0156136 A1 * | 7/2006 | McBride | | 714/736 |
| 2008/0141087 A1 * | 6/2008 | Whetsel | | 714/726 |
| 2008/0178054 A1 * | 7/2008 | Lee et al. | | 714/719 |

* cited by examiner

*Primary Examiner* — Guerrier Merant
(74) *Attorney, Agent, or Firm* — Yi-Shan Yang

(57) ABSTRACT

A system for testing electronic circuits is configured to receive a test signal and an ideal response signal and output a test result signal. The system for testing electronic circuits includes a circuit portion under test, a comparator and a comparison result recorder. The circuit portion under test receives a test signal from a test instrument, and outputs a system response signal. The comparator receives the system response signal from the circuit portion to be tested and receives an ideal response signal from the test instrument. The comparator outputs comparison results according to the system response signal and the ideal response signal. The comparison result recorder receives and records the comparison result. The system receives at least a portion of test signals and at least a portion of ideal response signals in a dynamically configurable time-interleaved manner via one or more physical channels from a test equipment.

20 Claims, 28 Drawing Sheets

Time A

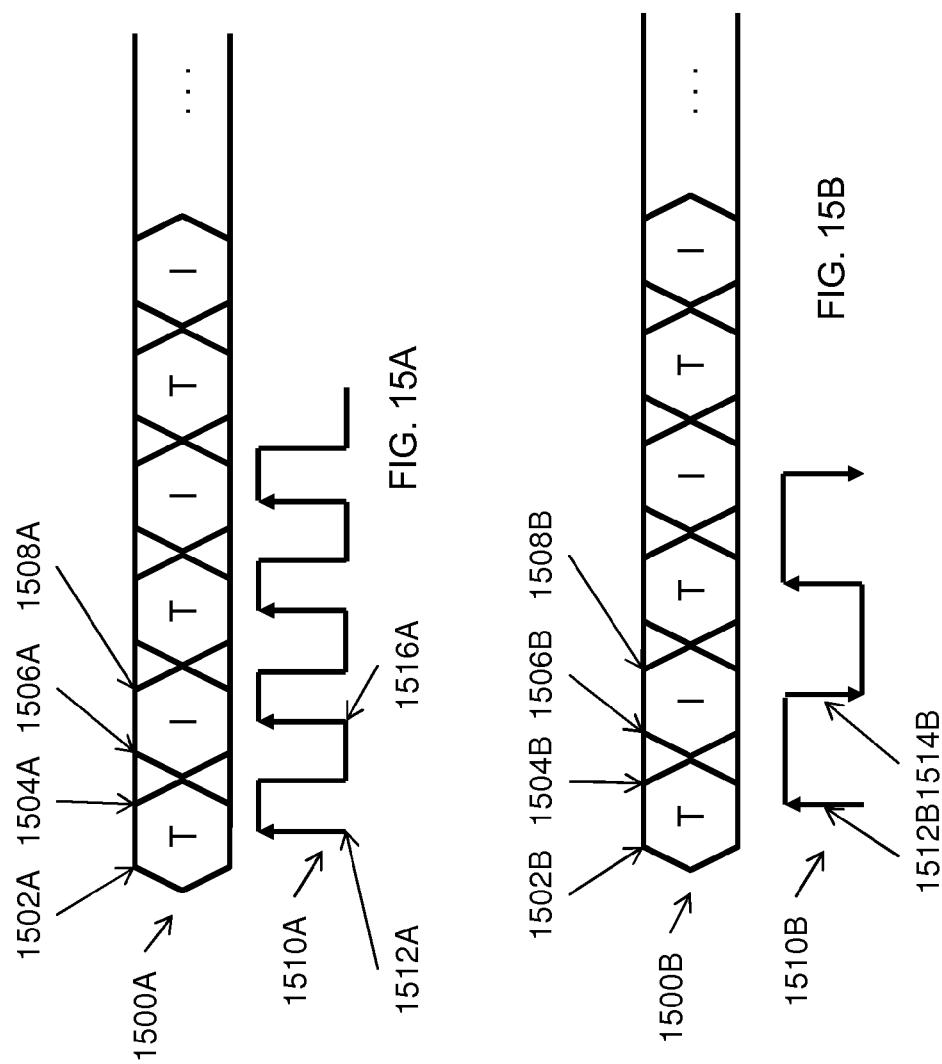

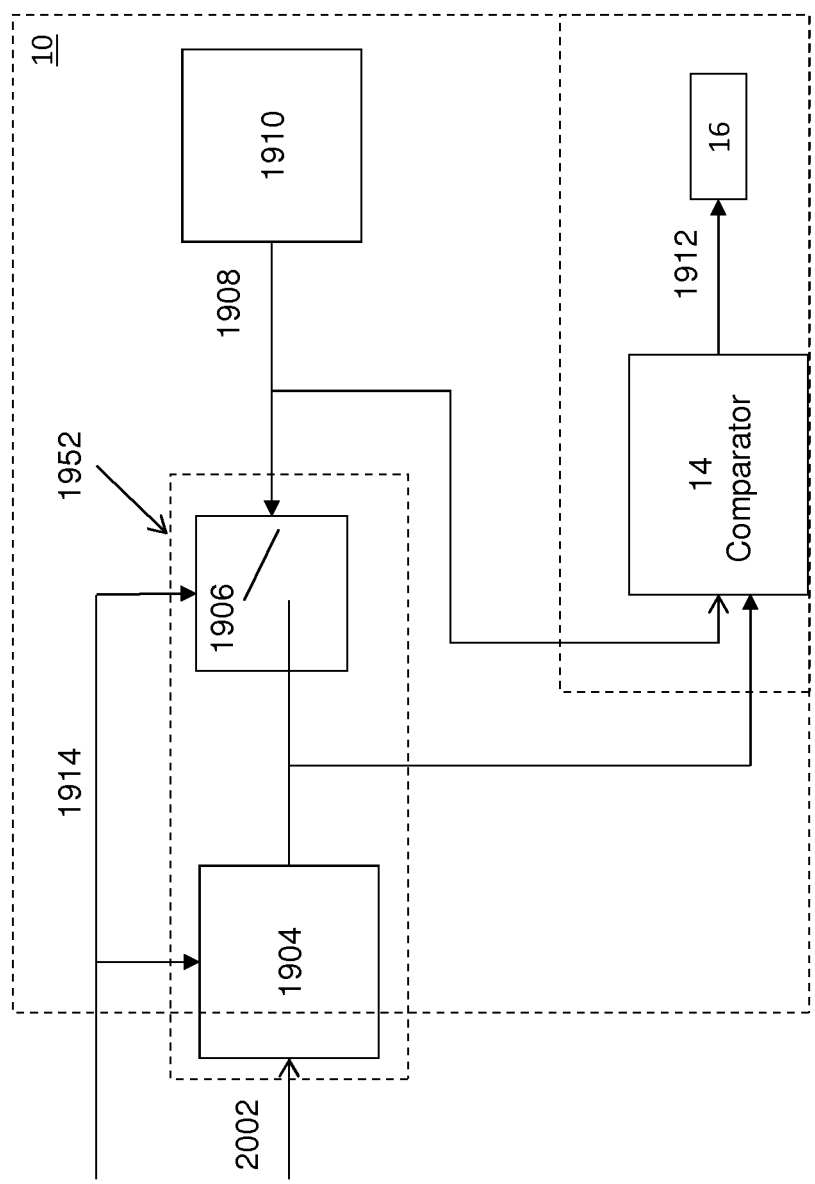

METHODS AND SYSTEMS FOR TESTING ELECTRONIC CIRCUITS

CROSS REFERENCE TO RELATED APPLICATION(S)

The application is a continuation in part of U.S. patent application Ser. No. 12/766,886, now U.S. Pat. No. 8,694.845, entitled "METHODS AND SYSTEMS FOR TESTING ELECTRONIC CIRCUITS" tiled on Apr. 25, 2010. The entire content of the aforementioned U.S. patent application is hereby expressly incorporated by reference for all purposes.

FIELD OF THE INVENTION

The present invention relates to a circuit and method for testing the same, and more particularly to an error comparison circuit and method for testing the same.

BACKGROUND OF THE INVENTION

Integrated circuits have been in existence for around half a century. With the development of technologies, various integrated circuit technologies have been proposed. Chips fabricated with integrated circuits have been widely applied in various different products.

During the chip design or manufacturing process, chips may fail due to various different reasons. As a result, in the chip manufacturing process, chips need to be tested. If it is determined that a chip fails during any stages of the manufacturing process, subsequent production processes of the chip are stopped so as to prevent the manufacturing cost from increasing due to wasted labor.

Wafer testing is usually conducted by conducting probe-test on each chip on a wafer. A test instrument uses a test probe to contact bonding pads on the chip and transmit a particular test signal to the chip under test. The test instrument receives a system response from the chip and compares the system response with an ideal response.

However, it takes test time for the test instrument to transmit the particular test signal to and read the response from the chip under test. The greater the number of chips the need to be tested on a wafer is, the more the time will be spent in testing the chips on the wafer. The use of parallel testing can reduce the total test time. In addition, the test instrument requires signal channels for transmitting signals to and receiving signals from the chips. For a common setting of parallel testing, substantially identical or similar data transmitted into each chip under test, and such substantially identical or similar data may be transmitted in parallel. Nonetheless, the reception of particular signals requires each chip under test be configured with a separate channel. In many cases, the number of signal channels of the test instrument limits the maximum number of chips that may be tested in one parallel test.

SUMMARY OF THE INVENTION

One or more embodiments are directed at a generic and reusable system for testing electronic circuits and method for the same. The system for testing electronic circuits is configured to receive a test signal and an ideal response signal and transmit a test result signal. The system for testing electronic circuits comprises a circuit portion to be tested, a comparator, and a comparison result recorder in the single embodiments or in some embodiments. The system for testing electronic circuits and method are generic in the sense that the same method may be applied to testing of various different electronic circuits, such as digital circuits, analog circuit, mixed-signal circuits, or a memory device. The same architecture or substantially the same architecture of the system for testing electronic circuits may also be used or even embedded in various different electronic circuits such as an analog circuit, a digital circuit, a mixed-signal circuit, or a memory device with very little or minimal modifications without departing from the spirit of various embodiments. It shall be noted that memory devices are generally considered as digital circuits. Nonetheless, the tests for memory devices are somewhat different from other digital circuits, and thus the Application makes such distinctions.

The circuit portion of the chip under test to be tested receives a test signal from a test instrument and outputs a system response signal in the single embodiment or in some embodiments. One of ordinary skill in the art certainly understands that the terms "a test signal" and "a system response signal", although both are represented in singular form, represent one or more test signals transmitted into and one or more response signals received from the chip under test. The comparator receives the system response signal from the circuit portion to be tested and receives an ideal response signal from the test instrument. Then, the comparator outputs a comparison result based at least in part the system response signal and the ideal response signal in the single embodiments or in some embodiments.

The comparison result recorder receives and records the comparison result. In one or more embodiments, the comparison result recorder may record whether or not an error occurs to the circuit portion to be tested within a period of test time. In one or more embodiments, the comparison result recorder stores the comparison result and outputs a test result signal to the test instrument according to the comparison result.

In addition or in the alternative, one or more embodiments of the invention further provide an system for testing electronic circuits, comprising, a comparator, and a comparison result recorder, in which the circuit portion to be tested comprises a memory. In addition to receiving a test signal and an ideal response signal, the system for testing electronic circuits is further configured to receive a control signal. The control signal may be used for controlling to process of storing to or reading from the memory. In the single embodiment or in some embodiments, the system for testing electronic circuits may further comprise a circuit portion to be tested.

Furthermore, in the single embodiment or in some other embodiments, the system for testing electronic circuits may further comprise a digital interface. The digital interface may be used for transferring a test signal to the circuit portion to be tested, to transfer an ideal response signal to the comparator, and/or to receive a test result signal from the comparison result recorder.

Moreover, one or more embodiments further disclose that the comparison result stored in the comparison result recorder of the system for testing electronic circuits may be transmitted to the test instrument after the test instrument initiates a read request.

One or more embodiments further disclose that the entire system for testing electronic circuits or a portion thereof may be disposed on a wafer or on any other types of semiconductor substrates (hereinafter a semiconductor substrate). That it, some or all of the circuit portion to be tested, the comparator, and the comparison result recorder are located on a semiconductor substrate.

Some embodiments are directed at a system for testing electronic circuits on a semiconductor substrate. In these embodiments, a test equipment including a test vector or test signal generator transmits at least a portion of the test signal and at least a portion of the ideal response signal in a time-interleaved manner during at least a time period shorter than the entire duration of the testing the electronic circuits. The time-interleaved signal may include one or more repeating patterns of signals, wherein a repeating pattern includes a part of the at least a portion of the test signal that is time-interleaved and followed by a part of the at least a portion of ideal response signal and repeats the two parts for a number of times or for a certain time period. The time-interleaving of a repeating pattern is dynamically configurable during the test of the electronic circuits in some embodiments. Multiple systems for test electronic circuits may be connected to a test equipment in parallel to conduct testing on the multiple electronic circuits on these multiple systems in parallel. These multiple systems may receive identical or different test signals and ideal response signals from the test equipment for the parallel testing in some embodiments.

Furthermore, one or more embodiments provide a method for testing an electronic circuit on a semiconductor substrate, which comprises transferring a test signal to a circuit under test, transferring an ideal response signal to the circuit under test, and obtaining a test result from the circuit under test. Through the system for testing electronic circuits and the method for testing the circuit under test provided by various embodiments, the test time and the number of signal channels required by the test instrument may be greatly reduced. In some embodiments, the system for testing electronic circuits may include demultiplexing circuitry to receive and demultiplex a multiplexed signal stream and to transmit the demultiplexed signals to the corresponding modules to reduce the total number of physical channels needed for transmitting various signals from a test equipment to an electronic circuit under test. In some of these embodiments where the system for testing electronic circuits include an interface, the interface may include the demultiplexing circuitry. In some embodiments, the system for testing electronic circuits including a demultiplexing circuitry unit or module uses the demultiplexing circuitry unit or module to receive test signals and ideal response signals in their entireties. In some other embodiments, the system for testing electronic circuits including a demultiplexing circuitry unit or module uses the demultiplexing circuitry unit or module and one or more additional physical channels in the system that are operatively connected to the comparison circuitry module to transmit all of the test signals and all of the ideal response signals for testing the electronic circuits.

It shall be noted that demultiplexing circuitry may or may not necessarily be a demultiplexer. In various embodiments, demultiplexing circuitry includes a demultiplexer, a multiplexer, a demultiplexing module including one or more demultiplexers where a port of at least one demultiplexer cascades into another multiplexer or demultiplexer, or any other devices that receives at least a single input signal, demultiplexes the single input signal, and selects one of multiple output channels for transmitting the demultiplexed signal portion. The multiplexed signal stream may include at least a portion of test signals and at least a portion of ideal response signals. In some embodiments, the at least a portion of test signals and the at least a portion of ideal response signals may be multiplexed in a time-interleaved manner with one or more reconfigurable interleave lengths. In some embodiments, the multiplexed signal may further include error correction code or error detection code, in addition to the at least a portion of test signals and the at least a portion of ideal response signals.

Some embodiments are directed at a system including an electronic circuit portion performing one or more functions as designed during normal operations. The system may further include a switch and one or more input/output ports, at least one of which may be configured to act as an input port during testing of the electronic circuit portion and as an output port during normal operations of the electronic circuit portion performing its various functions as designed. The switch is operatively connected to the at least one input/output port, and the system may receive a control signal from a source external to the system to open the switch and to set the at least one input/output port to act as an input port to receive at least a portion of an ideal response signal during the testing of the electronic circuit. The system may also receive a control signal from the source external to the system to close the switch and to set the at least one input/output port to act as an output port to transmit the normal output signals of the electronic circuit during normal operations of the electronic circuit. The system may further include

BRIEF DESCRIPTION OF THE DRAWINGS

FIGS. 15A-B illustrate two examples of transmitting time interleaved test signals and ideal response signals using a clock signal.

FIG. 20 illustrates a partial view of a system schematic diagram for a system for testing an electronic circuit portion while the electronic circuit portion is under test in some embodiments.

DETAILED DESCRIPTION OF THE INVENTION

The detailed features and advantages of various embodiments are described below in greater details by way of examples, the contents of the detailed description are disclosed in a manner to enable those skilled in the art to understand and to make and use the technical contents and any slight or obvious variations contained herein. various embodiments. Based upon the contents of the specification, the claims, and the drawings, those skilled in the art can easily understand the relevant objectives and advantages. The following embodiments are intended to illustrate and explain various embodiments in further detail by way of examples and/or illustrations but do not intended to limit the scope of the invention or the claims in any way.

Figure 1A:
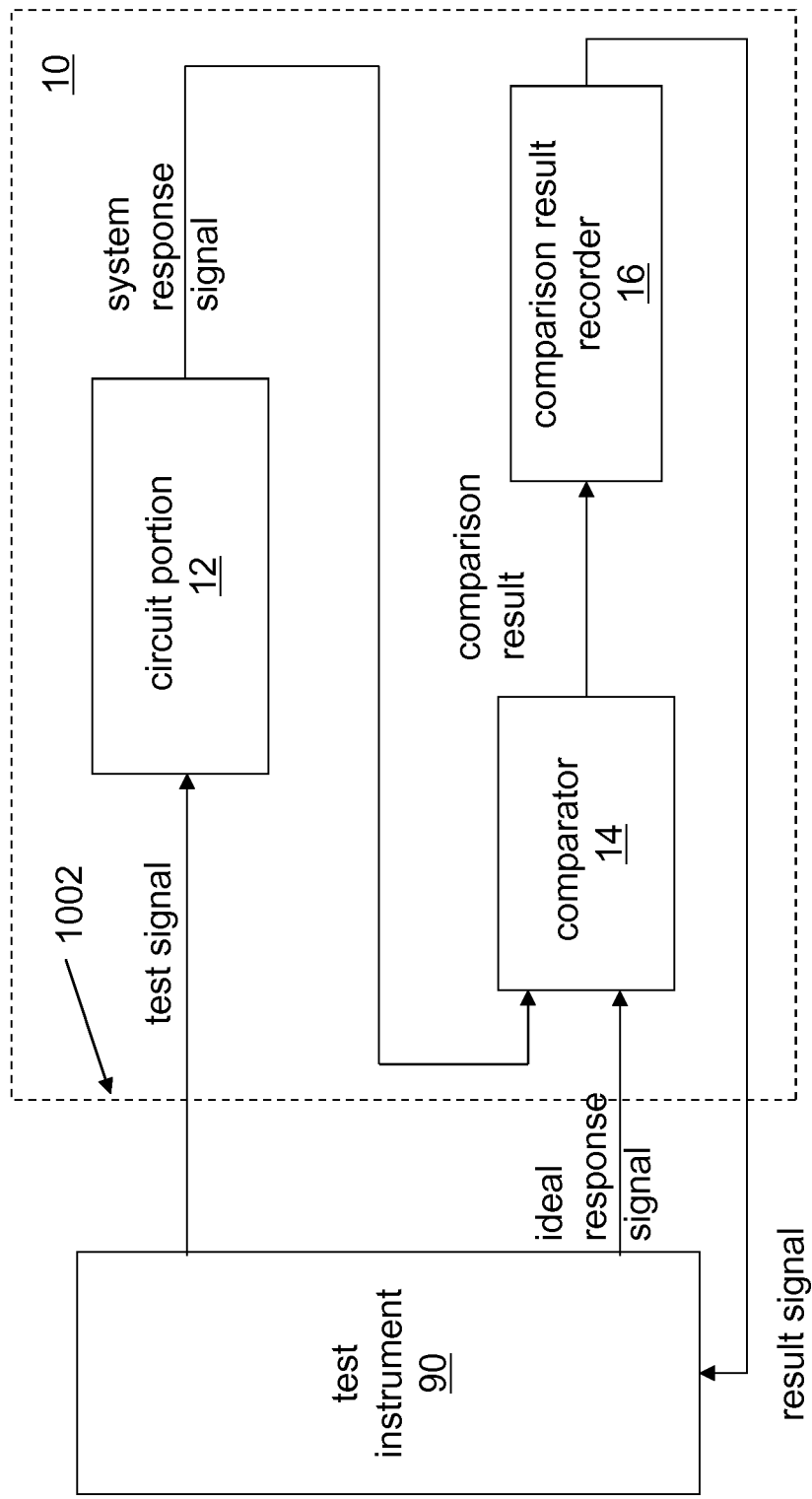
FIGS. 1A-C illustrate high level diagrams for system for testing electronic circuits in some embodiments.

FIG. 1A illustrates a system block diagram of a first embodiment of the invention. In the first embodiment, a system for testing electronic circuits 10 is provided. The system for testing electronic circuits 10 is configured to receive a test signal and an ideal response signal from a test instrument 90, such as the Agilent® 9300 automatic test equipment or the Credence® Diamond series, Sapphire series, X-series, or ASL series Testers, and output a test result signal. In some embodiments where the system response signal is determined to be different from the ideal response signal, this mismatch or difference between the two signals indicates that there may have an error in the circuit under test. On the other hand, the fact that the system response signal perfectly matches the ideal response signal does not always result in the conclusion that the system response signal is correct in some embodiments. Whether or not the match between the two signals indicates that the circuit under test is functioning as designed depends upon the completeness of the response signal. The system for testing electronic circuits 10 comprises a circuit portion 12 that is to be tested, a comparator 14, and a comparison result recorder 16. In some embodiments, the system for testing electronic circuits 10 comprises the comparator 14 and the comparison recorder 16 but not the circuit portion 12 as indicated by the imaginary boundary 1002 that excludes the circuit portion 12 from the system for testing electronic circuits 10.

The circuit portion 12 to be tested may comprise a digital circuit in the first embodiment or in some embodiments. In the first embodiments or in some other embodiments, the circuit portion 12 to be tested may comprise a mixed-signal circuit which further comprises a digital circuit. The circuit portion 12 to be tested may comprise a memory circuit in the first embodiment or in some embodiments. The circuit portion 12 to be tested may also comprise an analog circuit. In the first embodiment or in some embodiments where the circuit portion 12 to be tested comprises a digital circuit is illustrated for explanation and illustration purposes. In one embodiment, the circuit portion 12 to be tested comprises a memory circuit. In another embodiment, the circuit portion 12 to be tested comprises an analog circuit.

In this embodiment or in some embodiments, the circuit portion 12 to be tested comprises a digital circuit, and the circuit portion 12 to be tested receives a test signal from the test instrument 90. The test signal may comprise a serial digital signal or a test vector; the test signal is not, however, limited thereto, and any signal that may be input to the circuit portion to be tested may be used as the test signal. After the circuit portion 12 to be tested receives the test signal, the circuit portion 12 to be tested outputs one or more system response signals in response to the test signal generated through one or more operations in the circuit portion 12 to be tested. One of ordinary skill in the art will clearly understand that the system response signals vary and are generated in response to the test signal.

The comparator 14 receives the system response signal from the circuit portion 12 to be tested and receives an ideal response signal from the test instrument 90. The ideal response signal comprises a system response signal generated by the circuit portion 12 to be tested after receiving the test signal when the circuit portion 12 to be tested is error-free in the first embodiment or in some embodiments. In the single embodiment or in some embodiments, the ideal response signal may also be referred to as an error-free system response signal. One of ordinary skill in the art will clearly understand that the ideal response signal may vary and comprises a signal that is expected to be generated by the circuit portion under test 12 in accordance with what the design of the circuit portion under test 12 is designed or intended to generate in response to the test signal in the signal embodiment or in some embodiments. The comparator 14 outputs a comparison result based at least in part upon the system response signal generated by the circuit portion 12 to be tested and the ideal response signal.

When the system response signal is determined to be identical to the ideal response signal, the comparison result output by the comparator 14 comprises a "correct" signal which may take many forms such as a unique signal representing the correctness of the comparison result or a bit stream which corresponds to various status of the comparison results. One of ordinary skill in the art understands that the comparison result output may also take other forms for the same purpose, and these other forms are deemed obvious variations and are thus within the scope of the disclosure of the Application. When the system response signal is determined to be different from the ideal response signal, the comparison result output by the comparator 14 comprises an "error" signal, which may also take various forms to indicate the that the circuit portion under test 12 generates an unexpected signal in response to the test signal.

The comparison result recorder 16 receives and records the comparison result in the single embodiment or in some embodiments. The comparison result recorder 16 may record whether an error occurs to the circuit portion 12 to be tested within a period of test time based at least in part upon the comparison results. The comparison result recorder 16 stores the comparison results in a non-transitory computer or machine readable storage medium, for example but not limited to, a volatile or non-volatile memory, and outputs a test result signal to the test instrument 90 based at least in part upon the comparison results. It shall be noted that the terms "non-transitory computer or machine readable storage medium" and "memory" for various storage or access purposes are used interchangeably throughout the specification to indicate any tangible storage medium that is used for storing information or data in one or more desired formats and is characterized by being able to be accessed by general or special purpose computers or machines such as electronic circuit test equipment.

Based at least in part upon the system for testing electronic circuits 10, the system for testing electronic circuits 10 may output the final test result signal to the test instrument 90 in the single embodiment or in some embodiments. That is, the test instrument 90 may read the final test result signal, which indicates the comparison results from the comparator 14 or the comparison result recorder 16 instead of the system response signals from the error comparison circuit or system 10. In these embodiments, the amount of data or information received by the test instrument 90 may be greatly reduced by using the system for testing electronic circuits 10. In some embodiments, the system for testing electronic circuits 10 may record the test result of each test, whether the test succeeds or fails. In some embodiments, the system for testing electronic circuits 10 only records the test result of one or more tests when the one or more tests fail. In some embodiments, the system for testing electronic circuits 10 records whether the recorded test fails or succeeds. In some other embodiments, the system for testing electronic circuits 10 records not only whether the recorded test fails or succeeds but also the location(s) of successful or failed, recorded test. In one embodiment, the system for testing electronic circuits 10 is implemented to achieve various intended functions as designed without comprising a test pattern generator. In this embodiment or in some other embodiments, the test patterns for the circuit portion 12 are generated by the test instrument 90.

Figure 1B:
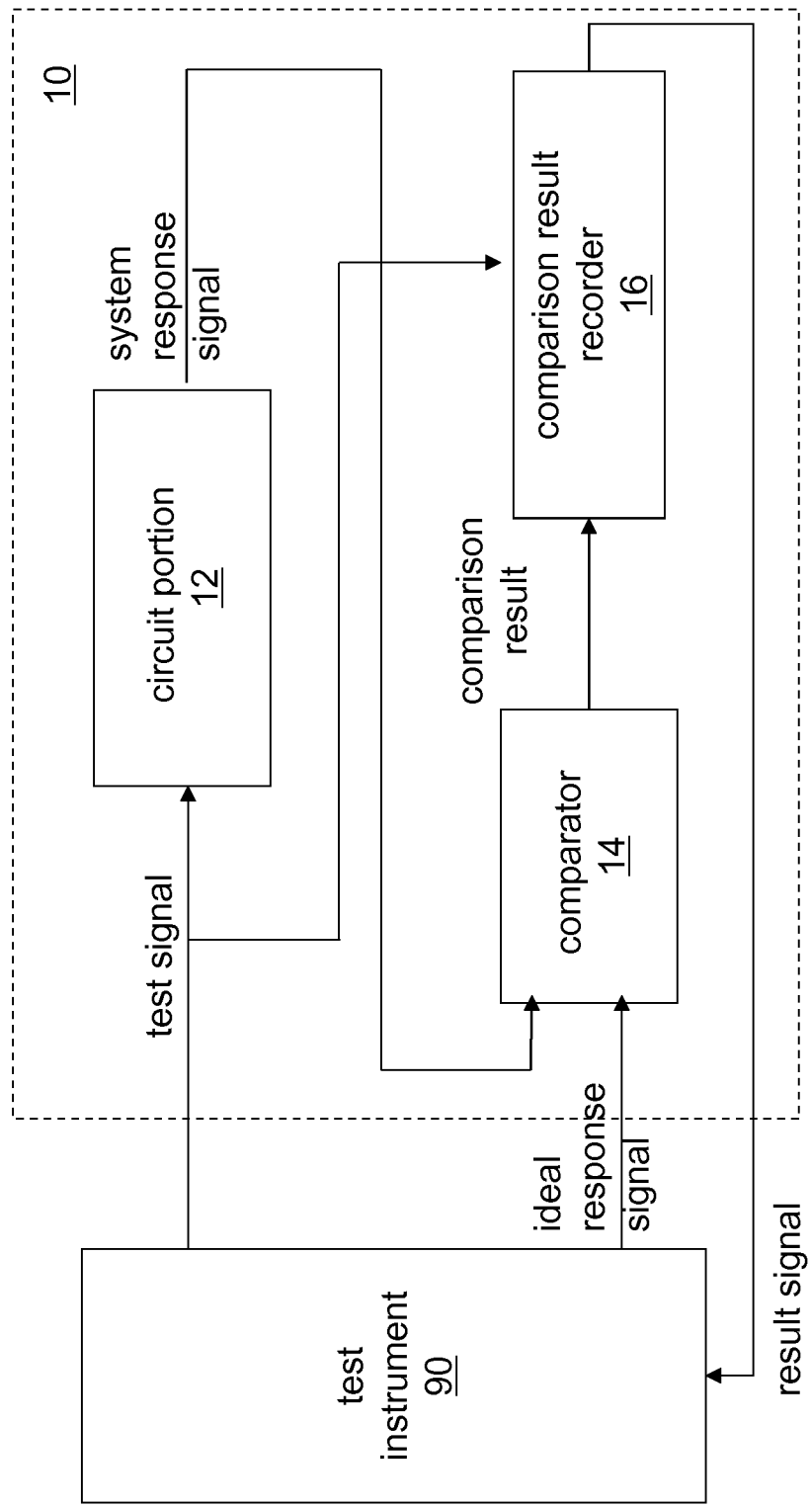
Figure 1C:
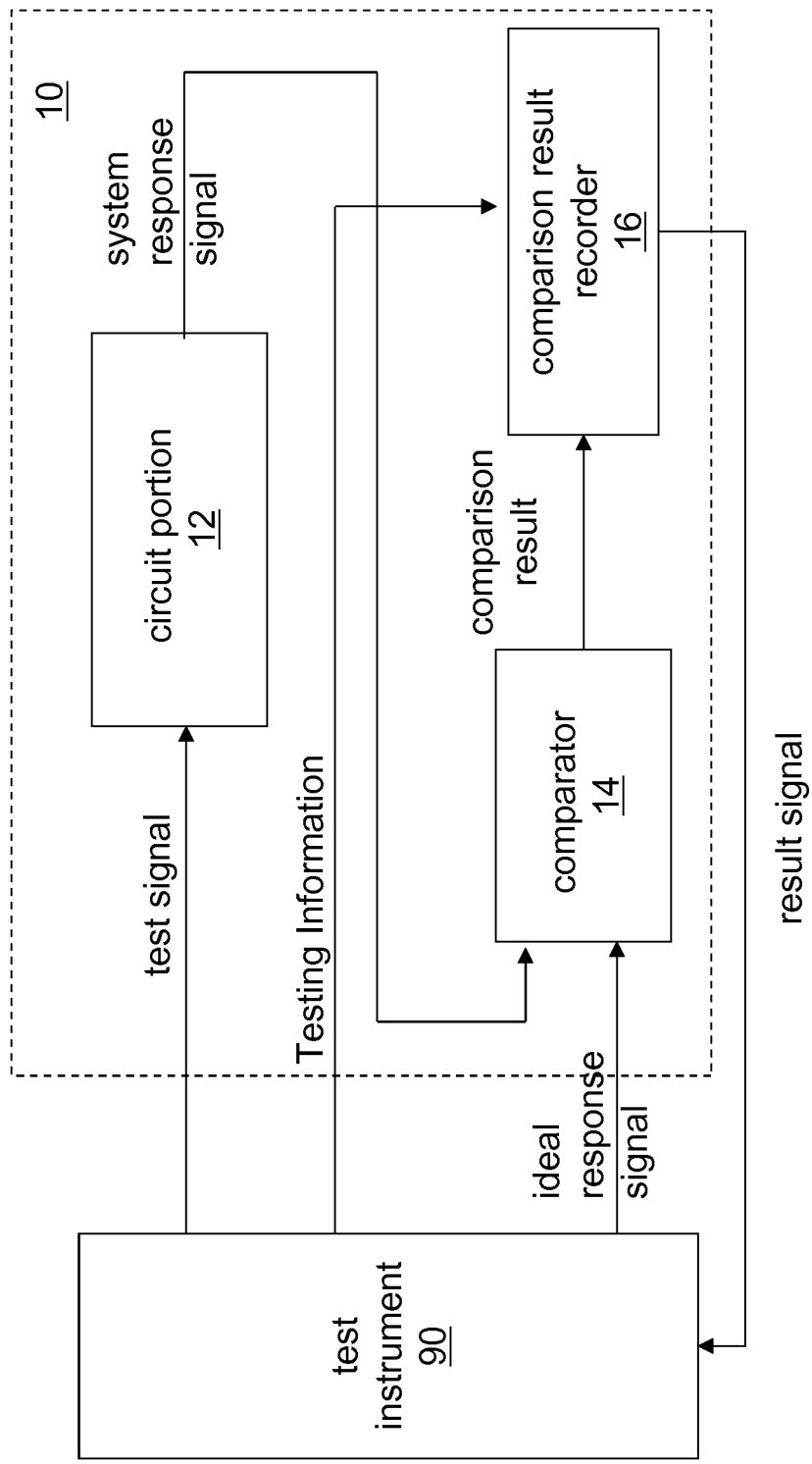

In one or more embodiments, the comparison result recorder 16 not only records whether an error has occurred but may also record the time when the error occurred or where the error occurred. In these embodiments, the comparison result recorder 16 receives the comparison result from the comparator 14 and the test signal or information about the test signal from the test instrument 90 as illustrated in FIG. 1B. The system for testing electronic circuits 10 may determine or identify the correlation between the test signal and the comparison result. The correlation between the test signal and the comparison result may be used to, for example but not limited to, determine where or when the comparison result is generated, the location or address of the portion of the circuit under test that results in the generation of the test signal, at which stage or point in the test the test signal is generated, etc. Such correlation may be provided for further improving, for example, the yield. For example, the recorded information, such as whether or where an error has occurred or when or at what particular stage of test the error occurred, etc., may be used to modify the manufacturing process or the corresponding mask design(s) or to modify the design of the electronic circuit under test so as to improve yield or performance of the electronic circuit under test In some embodiments as illustrated in FIG. 1C, the comparison result recorder 16 receives testing information instead of the test signal from the test instrument 90 such that the system for testing electronic circuits 10 may determine or identify the correlation between the test condition and the comparison. As illustrated in FIG. 1B, the correlation between the test signal and the comparison result may be used to, for example but not limited to, determine where or when the comparison result is generated, the location or address of the portion of the circuit under test that results in the generation of the test signal, at which stage or point in the test the test signal is generated, etc. Unlike the system for testing electronic circuits as illustrated in FIG. 1B, the comparison result recorder 16 receives the testing information instead of the test signal because the test signal may not carry sufficient information to adequately determine the desired correlation between the testing condition(s) and the test results. The testing condition may comprise, for example but not limited to, temperatures of the respective tests, voltages, currents, locations or addresses of the portion of the circuit under test, etc.

In one or more embodiments, the comparison result recorder 16 may identify a location that possibly causes the error based at least in part upon a portion of the test signal and record the time when the error occurred. For example, the recorder 16 may record the clock cycles or signals when an error occurs by, for example, counting the clock cycles. The designer or engineer knows what test is performed at a specific clock cycle and may then correlate the timing information to a specific portion of the circuit under test.

In one or more embodiments, the comparison result recorder 16 may know a position where the error occurred or may have occurred in the circuit portion under test from the test instrument 90 and record the time when the error occurred.

Figure 2A:
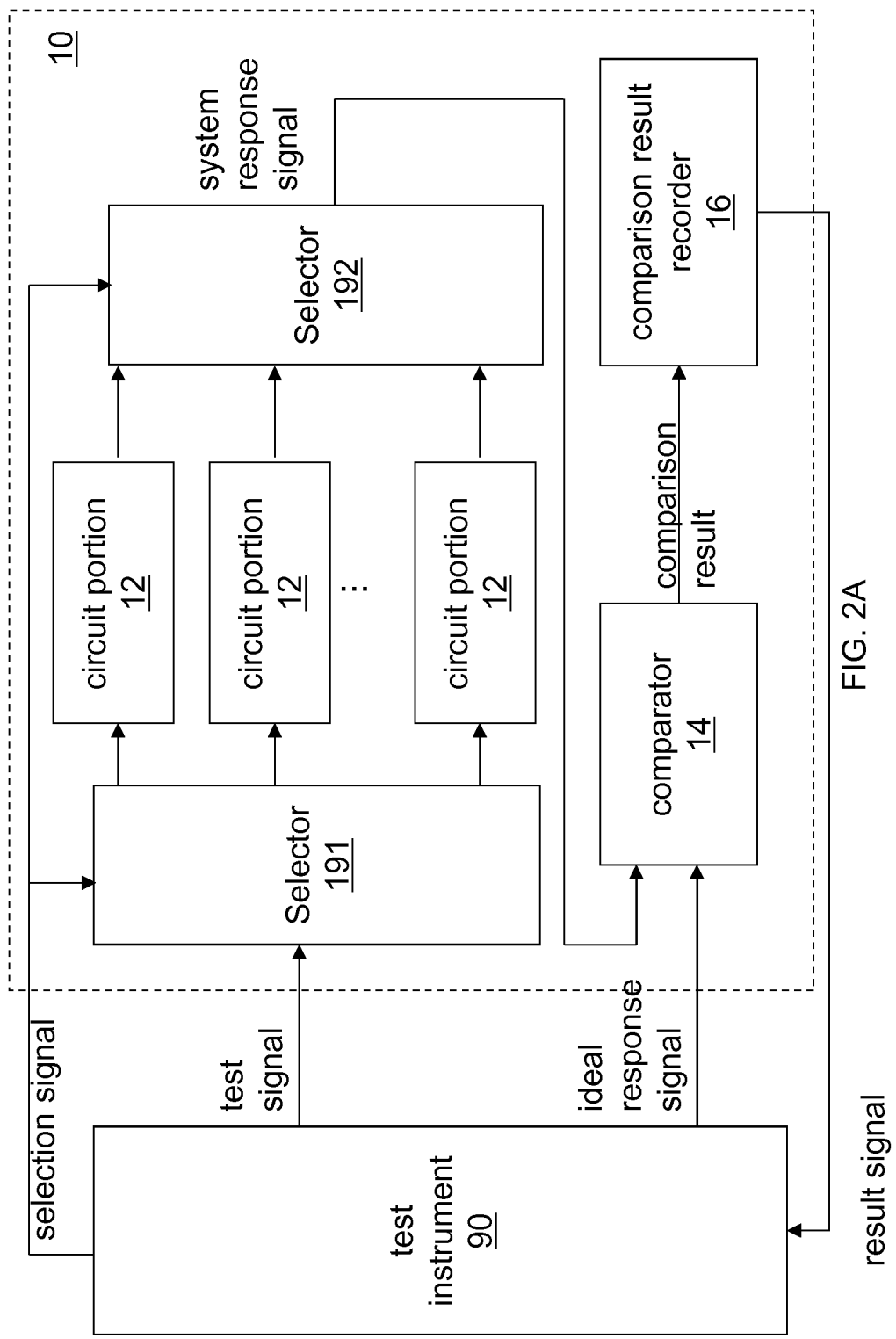
FIGS. 2A-B illustrate high level diagrams for system for testing electronic circuits in some embodiments.

The first embodiment shows only the testing of a single circuit portion 12 to be tested for explanation and illustration purposes, various embodiments of the Application are not limited thereto. FIG. 2A illustrates a system block diagram of a second embodiment of a system for testing electronic circuits 10. In this embodiment, the system for testing electronic circuits 10 comprises a plurality of circuit portions 12 to be tested, a selector 191, a selector 192, a comparator 14, and a comparison result recorder 16.

In the single embodiment or in some embodiments, the selector 191 comprises at least one input port and a plurality of output ports. The selector 191 may selectively connect the input port to one of the plurality of output ports. The input port of the selector 191 is connected to the test instrument 90, and the plurality of output ports of the selector 191 are respectively connected to the plurality of circuit portions 12 to be tested. The plurality of circuit portions 12 to be tested may then be connected to the selector 192 on a multiple-to-one basis. The selector 192 comprises a plurality of input ports and at least one output port in the single embodiment or in some embodiments. The selector 192 may selectively connect one of the input ports to the output port in the single embodiment or in some embodiments. The output port of the selector 192 may be connected to the comparator 14. The selector 191 may be configured for receiving a test signal and a selection signal. The selector 192 may also be configured for selectively transferring the test signal to one of the circuit portions 12 to be tested based at least in part upon the selection signal. The selector 192 may be configured to transfer a system response signal from the plurality of circuit portions 12 to be tested to the comparator 14.

In the single embodiment or in some embodiments, the error comparison circuit 10 may test the plurality of circuit portions 12 to be tested.

In one or more embodiments, the system for testing electronic circuits 10 may be disposed on a semiconductor substrate. Disposing the system for testing electronic circuits 10 on a semiconductor substrate will be described in greater details in subsequent part of the Application.

Figure 2B:
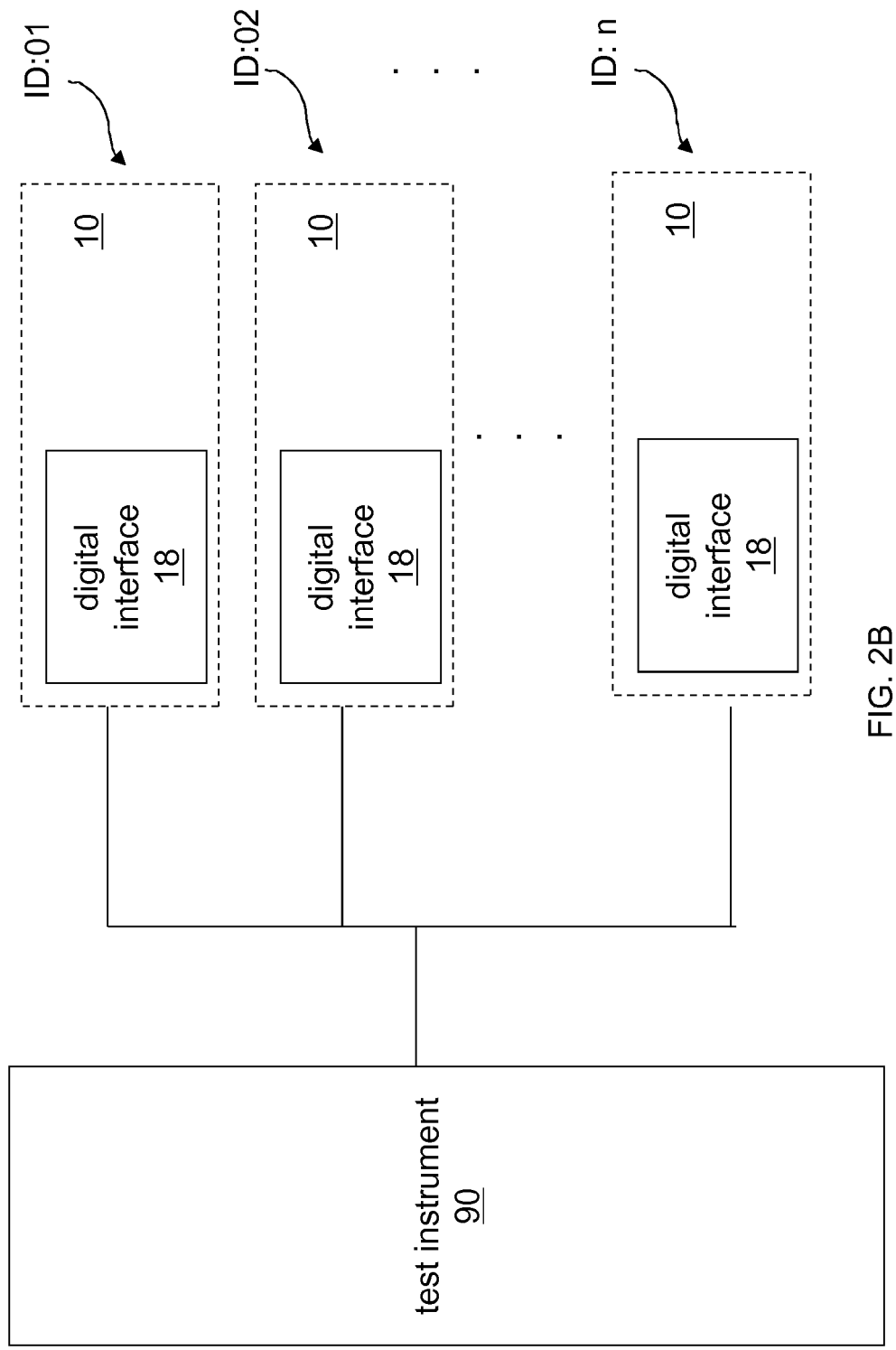

In one or more embodiments, the system for testing electronic circuits 10 may be connected to the test instrument 90 through one or more digital interfaces 18 as illustrated in FIG. 2B. The digital interface 18 may comprise, for example but not limited to, an inter-integrated circuit (I2C), a serial peripheral interface, or any other interfaces (hereinafter digital interface) suitable for interfacing between the test instrument 90 and the system for testing electronic circuits 10.

In one or more embodiments, the system for testing electronic circuits 10 may have its own unique ID which may use, for example, one or more bits to uniquely identify the corresponding system for testing electronic circuits 10. For example, the ID may comprise a four-tuple with, for example, identifications of 01, 02, 03, and 04 or 00, 01, 10, 11 in some embodiments. During a test with such an ID, the system for testing electronic circuits 10 may probe four circuits under test at once. Moreover, if we have eight sets of circuits under test to be tested with the four-tuple ID, the system for testing electronic circuits 10 may probe the eight circuits under test in two sets. In some embodiments, the system for testing electronic circuits 10 may further comprises a multiplexer (MUX) or a switch that is disposed between multiple sets of the circuits under test and the system for testing electronic circuits 10 to determine which set the system for testing electronic circuits 10 is reading the signals from.

In various embodiments, the system for testing electronic circuits 10 may comprise an n-tuple ID, wherein n is an integer. In one or more embodiments, a plurality of the system for testing electronic circuits 10 having their own IDs is connected in parallel through a digital interface. In one or more embodiments, the plurality of the system for testing electronic circuits 10 connected in parallel through the digital interface receives a test signal, and an ideal response signal may be transmitted to the plurality of the error comparison circuits at substantially the same time. One of ordinary skill in the art will understand that there may exist certain lag in transmission of two signals due to various reasons such as timing delay despite the two signals are intended or designed to be transmitted at exactly the same time. In some embodiments, each system for testing electronic circuits 10 records whether an error occurs. After the test is completed, the test instrument 90 respectively reads a test result record of the comparison result recorder 16 in each error comparison circuit 10 by using, for example, the circuit IDs.

Figure 3:
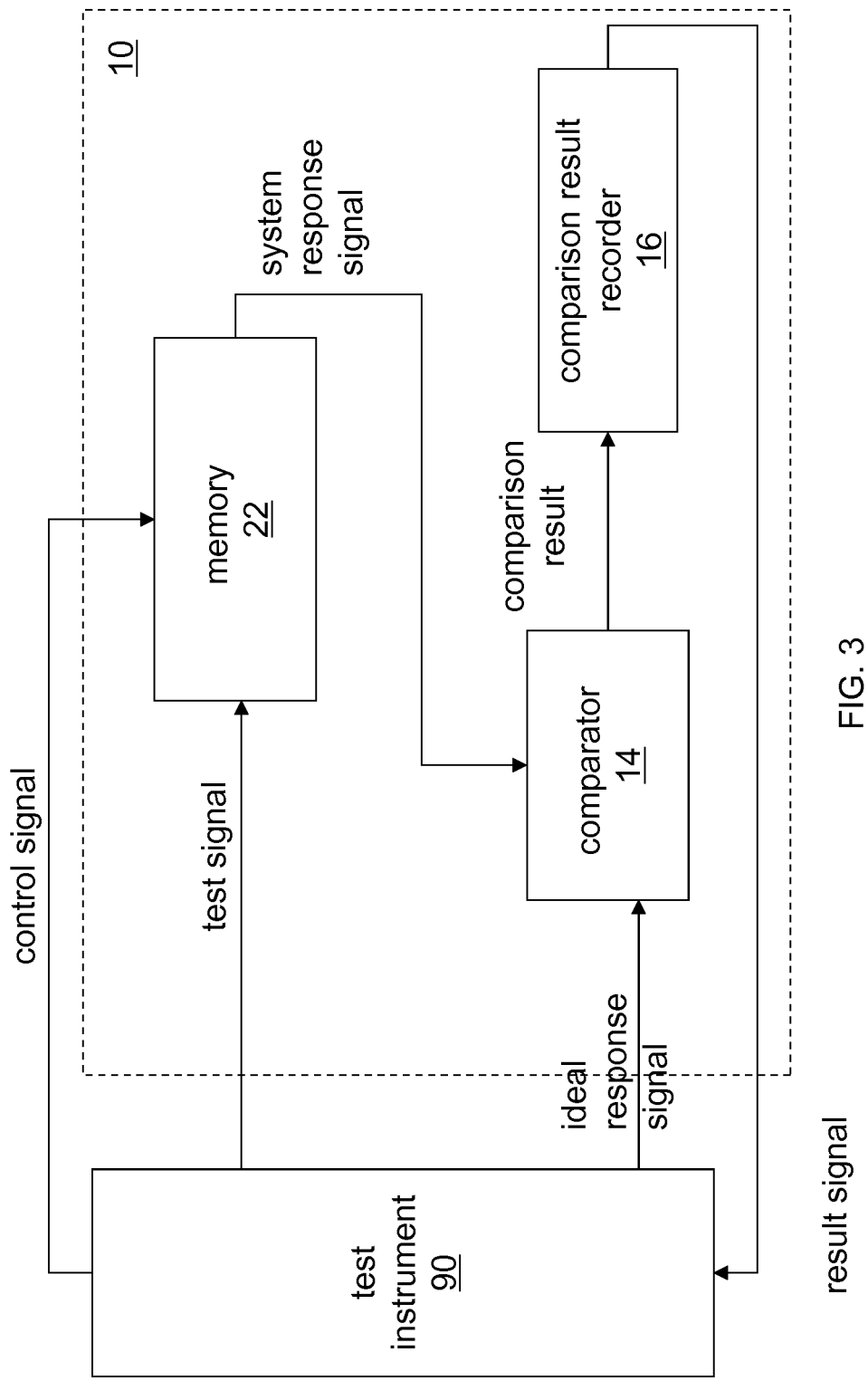
FIG. 3 illustrates a high level diagram for the system for testing electronic circuits.

In addition, in one or more embodiments, the circuit portion 12 to be tested comprises a memory circuit. FIG. 3 illustrates a system block diagram of a third embodiment. In the third embodiment, the system for testing electronic circuits 10 comprises a memory 22, a comparator 14, and a comparison result recorder 16. In addition to receiving a test signal and an ideal response signal, the system for testing electronic circuits 10 may further be configured to receive a control signal. The control signal may be used for controlling storing to or reading from the memory 22 in the single embodiment or in some embodiments.

In some embodiments where the control signal comprises a signal to store the test signal, the test instrument 90 may transfer the test signal to the memory 22, and the memory 22 may store the test signal therein. In the single embodiment or in some embodiments where the control signal comprises a signal to read the test signal, the memory under test 22 may receive a test signal and, in response to a control command, output the test signal to the comparator 14 as a system response signal.

Figure 4:
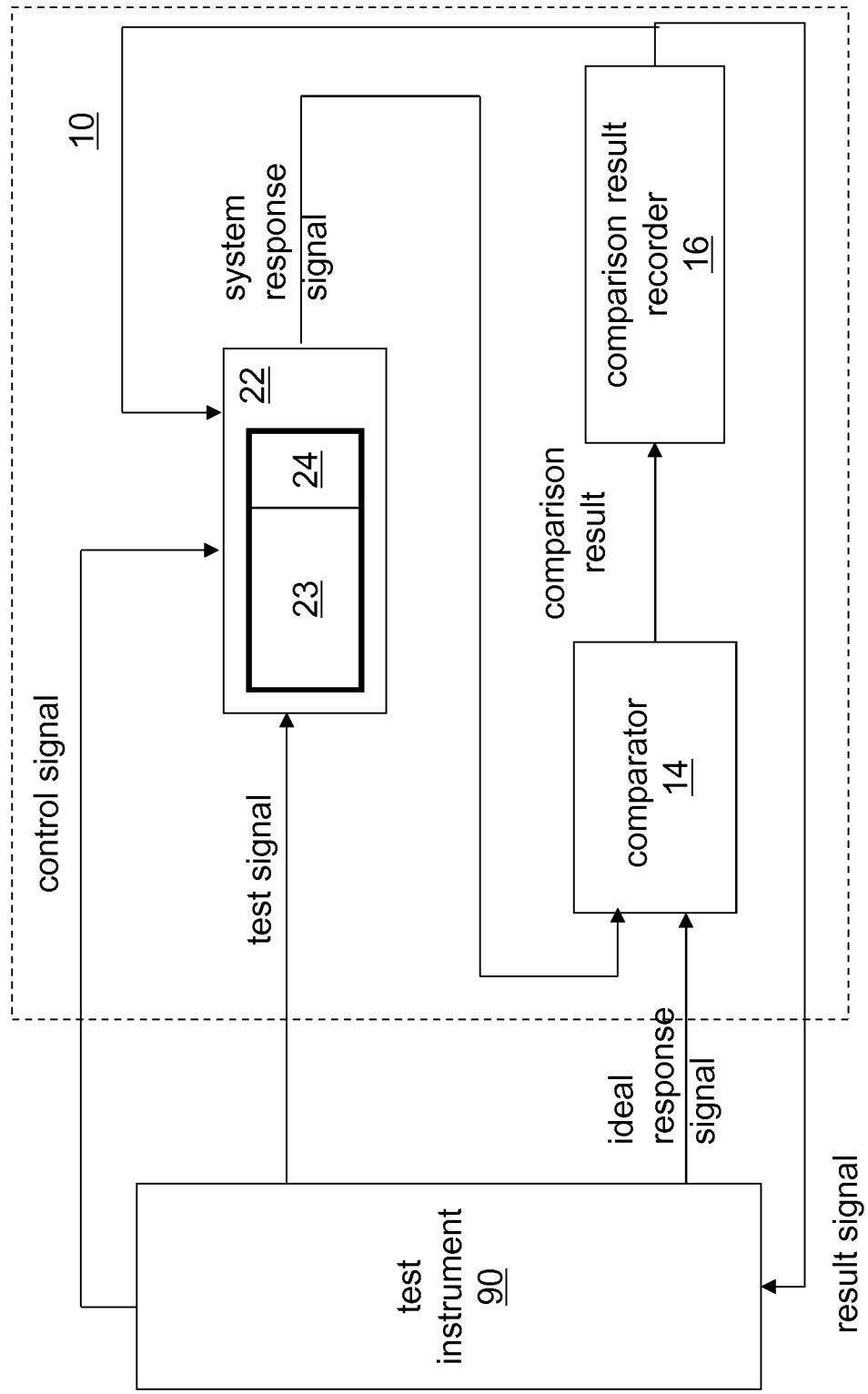
FIG. 4 illustrates a high level diagram for the system for testing electronic circuits.

In one or more embodiments, the memory 22 may comprise a plurality of memory cells. FIG. 4 illustrates a system block diagram of a fourth embodiment. The memory cells may be further divided into one or more primary memory cells 23 and one or more redundancy memory cells 24 in the single embodiment or in some embodiments. In some embodiments, in addition to controlling whether to store to or to read from the memory 22, the control signal may also be used for selecting one or more controlled memory cells for the corresponding controlling action. That is, the control signal may comprise at least one or more status signals (signals to store/read) and one or more cell numbers for the corresponding one or more status signals. In some embodiments, each cell number corresponds to one primary memory cell 23.

In the fourth embodiment, the comparison result recorder 16 may feedback a replacement signal to the memory 22. In the single embodiment or in some embodiments, the comparison result recorder 16 records that an error occurs to a primary memory cell 23, the primary memory cell 23 where the error occurs may be replaced by one of the redundancy memory cells 24. For example, when it is determined that a memory cell in the primary memory cells 23 corresponding to a cell number fails, the cell number may be changed to correspond to a memory cell in the one or more redundancy memory cells 24. In this manner, the failed memory cell may be replaced by a good memory cell, and thus the memory 22 may still function as intended during the testing of the memory 22 without performing any further testing or configuration to identify and replace the faulty memory cell(s).

Because the number of the redundancy memory cells 24 may be limited, the memory 22 may not be used normally if the number of failed primary memory cells 23 exceeds the number of the redundancy memory cells 24. That is, in this embodiment, the comparison result recorder 16 stores the number(s) or other means of identification of the redundancy memory cell(s) 24 in advance. When the number of replacement signals in a comparison result is greater than the number of the redundancy memory cells 24, the system for testing electronic circuits may determine that the memory 22 may not be used as intended. Accordingly, the comparison result recorder 16 records that the memory 22 has failed, or that the memory 22 may only be used as a lesser capacity memory.

In one or more embodiments, the comparison result recorder 16 may record a position in the primary memory cells 23 where an error occurs. After the one or more primary memory cells 23 in a memory cell are tested, the test instrument 90 may read data in the comparison result recorder 16, and determine, through one or more operations, how to use the redundancy memory cells 24 to replace the failed primary memory cells 23 in the memory cell in the single embodiment or in some embodiments. In these embodiments, the test instrument 90 writes the result into one or more lines of the memory 22. In the single embodiment or in some embodiments, the one or more lines may comprise one or more word lines, one or more bit lines, or any combination thereof. Then, a next memory cell may be tested until all the memory cells in the memory 22 have been tested. If the test instrument 90 determines that, during the testing of a memory cell, the one or more redundancy memory cells 24 may not be used to replace the failed primary memory cells 23 in the memory cell, the test instrument 90 may further determine that the memory 22 has failed for the intended purpose, or that the memory 22 may only be used for some lesser capacity memory.

In one or more embodiments, the memory 22 comprises a non-volatile memory so as to record a mode in which the one or more redundancy memory cells 24 are used to replace the failed primary memory cells 23.

In one or more embodiments, the one or more redundancy memory cells 24 may be located beside one or more word lines of the primary memory cells 23 for replacing one or more memory elements located on the same one or more word line.

In one or more embodiments, the redundancy memory cells 24 may be located beside one or more bit lines of the one or more primary memory cells 23 for replacing one or more memory elements located on the same one or more bit lines.

Figure 5:
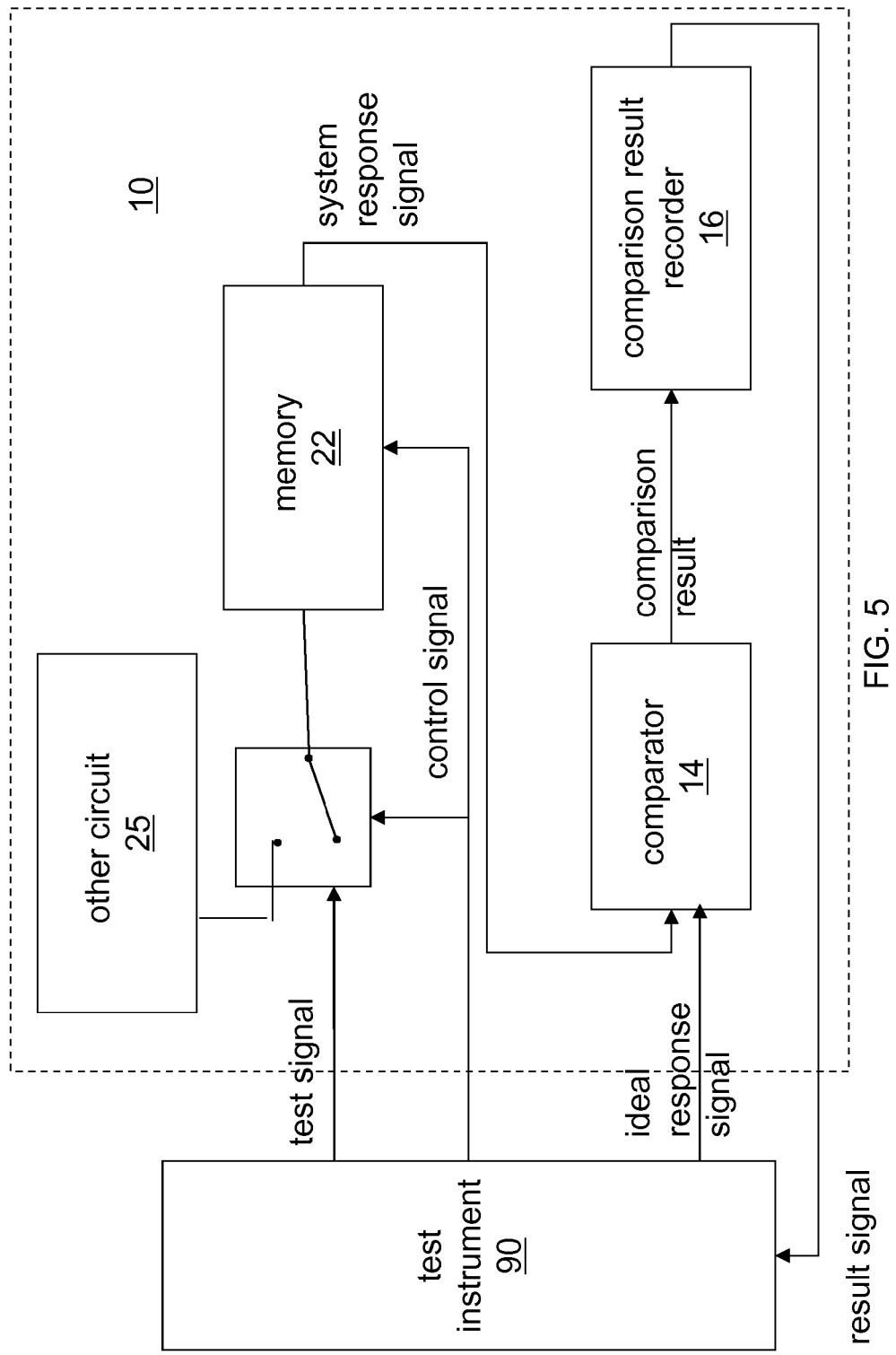
FIG. 5 illustrates a high level diagram for the system for testing electronic circuits.

FIG. 5 illustrates a system block diagram of a fifth embodiment. In the fifth embodiment, the system for testing electronic circuits 10 comprises a memory 22, other circuits 25, a comparator 14, a comparison result recorder 16, and a switch 26.

In the single embodiment or in some embodiments, the memory 22 may be electrically connected to the other circuits 25 to be tested through the switch 26. The switch 26 receives a switching signal and selectively transfers a test signal to the memory 22. In addition or in the alternative, the switch 26 may electrically connects the other circuits 25 to the memory 22 according to the switching signal.

In some embodiments where the circuit is in a normal working mode, the other circuits 25 may be connected to the memory 22 through the switch 26, and the other circuits 25 and the memory 22 may form a complete circuit. In the single embodiment or in some embodiments where the memory 22 needs to be tested, the memory 22 may be connected to the test instrument 90 through the switch 26. The test instrument 90 transfers a test signal and a control signal to the memory 22 through the switch 26 and tests the memory 22.

Figure 6:
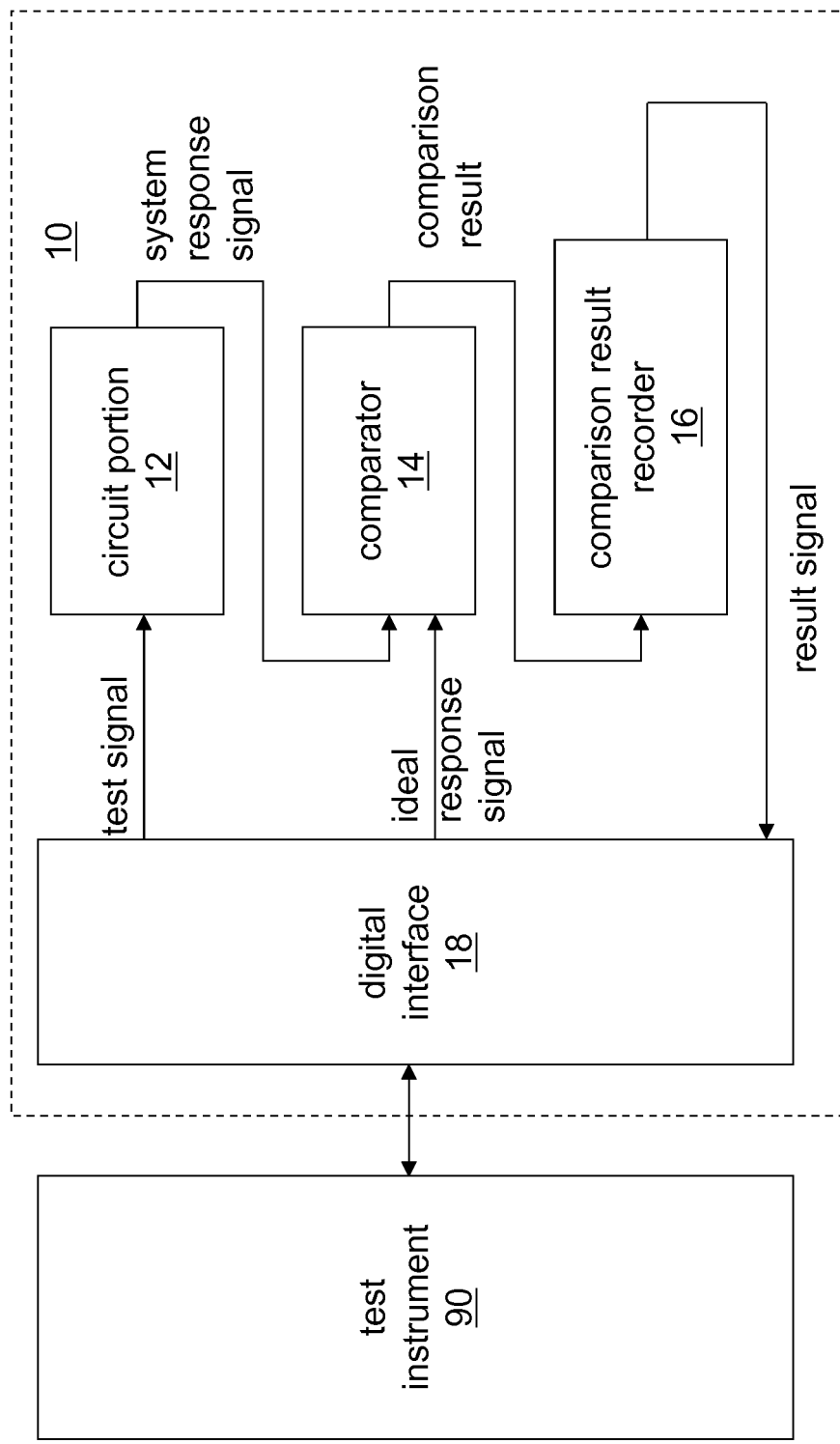
FIG. 6 illustrates a high level diagram for the system for testing electronic circuits.

FIG. 6 illustrates a system block diagram of a sixth embodiment of the system for testing electronic circuits. In the single embodiment or in some embodiments, the system for testing electronic circuits 10 comprises a circuit portion 12 to be tested, a comparator 14, a comparison result recorder 16, and a digital interface 18. The circuit portion 12 to be tested, the comparator 14, and the comparison result recorder 16 may be operatively connected to the digital interface 18. The digital interface 18 may be used for transferring a test signal to the circuit portion 12 to be tested in the single embodiment or in some embodiments. The digital interface 18 may also be configured for transferring an ideal response signal to the comparator 14 and for receiving a test result signal from the comparison result recorder 16. The digital interface 18 may be configured to connect to the test instrument 90. The digital interface 18 may comprise, but not limited to, an 12C or a serial peripheral interface in some embodiments.

In addition or in the alternative, the digital interface 18 may also be configured in conjunction with other embodiments.

In one or more embodiments, the circuit portion 12 to be tested comprises an analog circuit. In these embodiments where the circuit portion 12 comprises an analog circuit instead of a digital circuit or a memory circuit as described above, an ideal response signal of the analog circuit does not generally comprise a digital 0 or digital 1 but may comprise a voltage signal, a current signal, a frequency signal, a time signal, etc. In addition or in the alternative, an acceptable range of a system response signal of the analog circuit does not generally comprise a single value but may comprise a tolerance range so that various items to be compared by the comparator 14 and various items to be recorded by the comparison result recorder 16 may be slightly different from those when the circuit portion 12 to be tested comprises a digital circuit or a memory circuit. The following paragraphs illustrate various configurations by way of examples.

Figure 9:
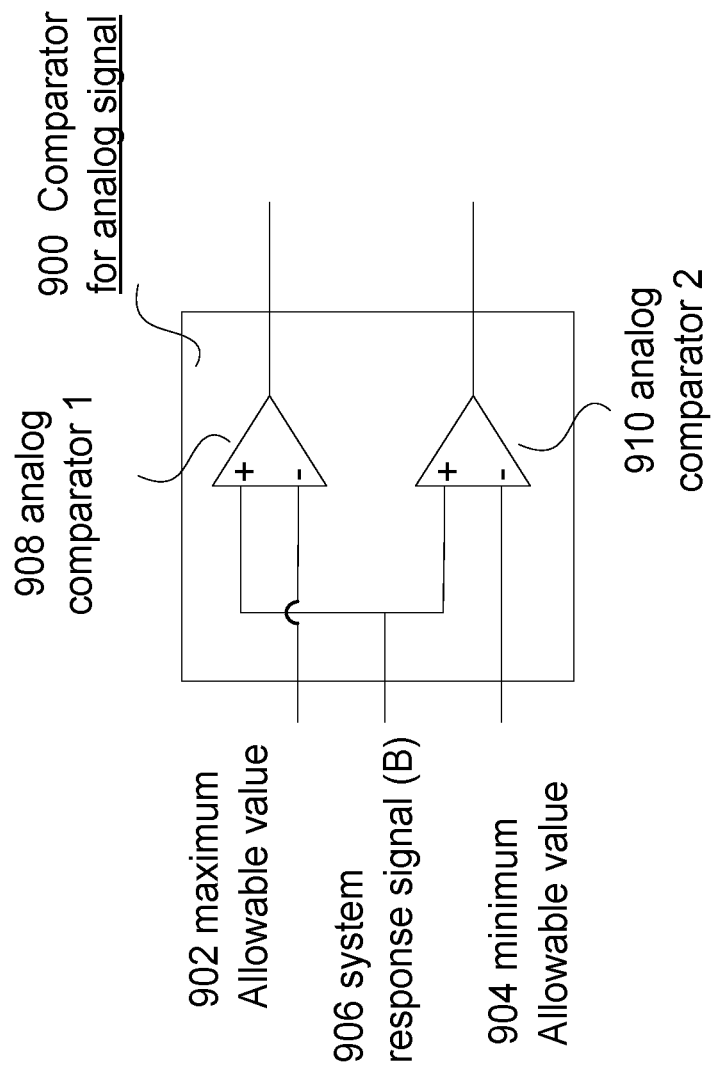
FIG. 9 illustrates a schematic representation of a comparator with multiple comparators for analog signals in some embodiments.

In one or more embodiments, the circuit portion 12 to be tested comprises an analog circuit; a system response signal of the circuit portion 12 to be tested in response to a test signal comprises a circuit property signal, for example, a voltage signal; an acceptable range of the circuit portion 12 to be tested in terms of the test item may comprise an ideal response signal voltage as the nominal value bound between a maximum allowable value and a minimum allowable value; and the comparator 14 compares values of voltages. As illustrated in FIG. 9 which illustrates a comparator for analog signals, the comparator 14 compares the system response signal 906 of the circuit portion 12 to be tested with the maximum allowable value (902) by using the analog comparator 1 (908). The comparator 14 further compares the system response signal 906 of the circuit portion 12 to be tested with the minimum allowable value 904 by using the analog comparator 2 (910).

The comparison result recorder 16 records a comparison result. In some embodiments where the comparison result shows that the system response signal voltage of the circuit portion 12 to be tested is smaller than the maximum allowable value, and the system response signal voltage of the circuit portion 12 to be tested is greater than the minimum allowable value, the circuit portion 12 to be tested is normal in terms of the test item. Otherwise, the circuit may not function normally. In one or more embodiments, the test instrument 90 may directly obtain a signal of the maximum allowable value, and a signal of the minimum allowable value. In the embodiments as illustrated in FIG. 9, if the outputs of comparators 908 and 910 constitute true and false, this indicates that the portion of the circuit under test is functioning normally. If the outputs of the comparators 908 and 910 are both true or are both false, this indicates that the portion of the circuit under test is not functioning normally.

In one or more embodiments, the circuit portion 12 to be tested comprises an analog circuit, a system response signal of the circuit portion 12 to be tested in response to a test signal comprises a current signal, the comparator 14 compares values of currents, the comparison result recorder 16 records a comparison result. When the comparison result shows that the system response signal current of the circuit portion 12 to be tested is within a range bounded by the maximum and minimum allowable values, the circuit portion 12 to be tested is considered normal in terms of the test item; otherwise, the circuit is considered not functioning normally. In one or more embodiments, a comparator 14 capable of comparing currents may comprise two resistors plus a combination of an operational amplifier and a latch circuit, wherein the resistors may convert input currents into voltages, and the operational amplifier and the latch circuit may be used to generate a comparison result.

Figure 10:
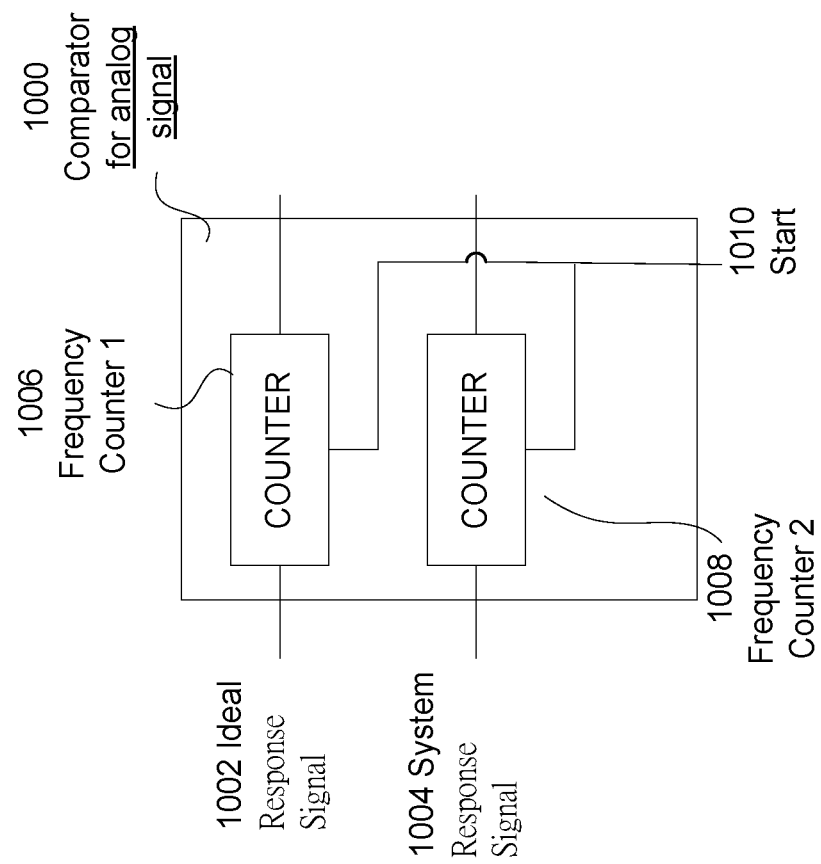
FIG. 10 illustrates a schematic representation of a comparator with multiple counters for analog signals in some embodiments.

In one or more embodiments, the circuit portion 12 to be tested comprises an analog circuit, and a system response signal of the circuit portion 12 to be tested in response to a test signal comprises a frequency signal. In one or more embodiments, the comparator 14 compares values of frequencies. In one or more embodiments, a method for comparing values of frequencies of the signals comprises calculating numbers of occurrences of rising edges (or falling edges) of two input signals. In these embodiments, the method performs the action of calculating the numbers of occurrences of rising (or falling) edges by using one or more counters. In one or more embodiments, the comparator 14 calculates the number of occurrences of the rising edges of a first signal. The comparator 14 may further calculate the number of occurrences of the rising edges of a second signal with a particular number of occurrences of the first signal in some embodiments. In some embodiments where the number of occurrences of the rising edges of the second signal is within a range defined by a target number of occurrences with a maximum allowable number of occurrences and a minimum allowable number of occurrences, the circuit is considered to be functioning normally; otherwise, the circuit is not considered to be functioning normally. In some embodiments, the comparator 1000 for analog signals may use a single comparator rather than a plurality of comparators as illustrated in FIG. 10. In these embodiments, the single counter may count the rising (or falling) edges of the system response signal 1004 within a predetermined time period and determine the frequency of the system response signal 1004. The single counter may then compare the so determined frequency of the system response signal 1004 with the known frequency of the ideal response signal 1002 determine whether the system response signal 1004 indicates normal functioning of the circuit portion under test. In these embodiments, the predetermined time period for determining the rising (or falling) edges need to be precise because a small variation of the time period corresponds to a large variation in the determined frequency of the system response signal 1004. In the embodiments as illustrated in FIG. 10 with a plurality of counters, both counters 1006 and 1008 are determining the number of rising (or falling) edges of the system response signal and the ideal response signal within the same time period. Therefore, the time period for the multiple counters configuration as illustrated in FIG. 10 needs not to be precise as long as both counters are determining the number of rising (or falling) edges within the same time period. 1010 Start indicates the initializing and invoking of the counters' functions for the comparator 14.

In one or more embodiments, the circuit portion 12 to be tested comprises an analog circuit, and a system response signal of the circuit portion 12 to be tested in response to a test signal comprises a time signal. In the single embodiment or in some embodiments, a system response signal of the circuit portion 12 to be tested in response to a test signal comprises a time signal. The time signal represents the time when the rising edge (or falling edge) of the signal occurs.

The comparator 14 compares a sequence of times when the rising edges of the signals occur in the single embodiment or in some embodiments. That is, the comparator 14 receives a system response signal from the circuit portion 12 to be tested at a specific instant and an ideal response signal within a temporal range, which is defined by an upper bound, a lower bound, and a nominal time, and then compares a sequence of times when one or more rising edges occur. In some embodiments where a rising edge of the system response signal received from the circuit portion 12 to be tested occurs between the rising edges of the one or more ideal response signals within the temporal range, the circuit is considered to be functioning normally; otherwise, the circuit is determined not to be functioning normally. One of ordinary skill in the art clearly understands that similar approaches may also be used to compare a sequence of times when falling edges of signals occur or to compare durations between two rising edges (or between two falling edges) of signals with two pulses at a certain interval.

Figure 11:
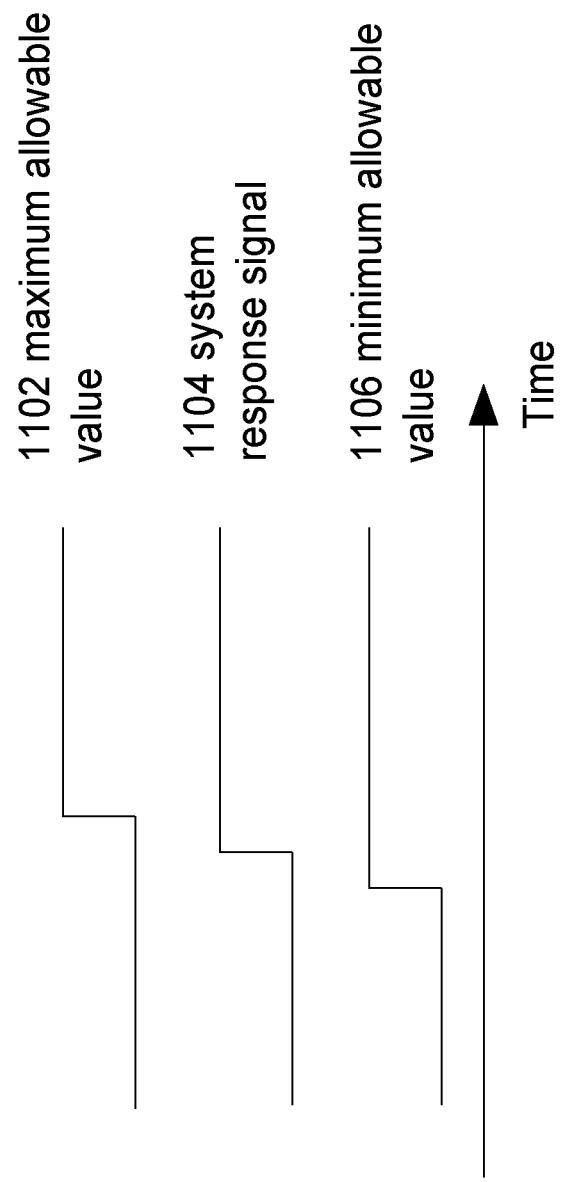
FIG. 11 illustrates a schematic representation of a system response signal relative to signals with maximum and minimum allowable values that indicates success of a test.

For example, the rising edges of two input signals may be compared to determine which signal arrives earlier than the other in some embodiments. In some embodiments, the arrival time of the response signal under test may be compared to the nominal time plus the upper bound for the temporal range or to the nominal time minus the lower bound for the temporal range for such determination. The schematic representation of the signals indicating the success of a test is illustrated in FIG. 11 where the rising edge of the system response signal 1104 falls between the rising edges of the signal with the maximum allowable value and the signal with the minimum allowable value. In one or more embodiments, the comparator 14 may comprise a combination of an operational amplifier and a latch circuit to compare values of two input voltages.

In one or more embodiments, the circuit portion 12 to be tested comprises an analog circuit, and a system response signal of the circuit portion 12 to be tested in response to a test signal comprises a mixed-signal circuit. In the single embodiment or in some embodiments, the mixed-signal refers to a signal that does not comprise a simple voltage signal, current signal, frequency signal, time signal, or other similar types of signals, but comprises an analog signal mixed with a variety of properties. In some embodiments, the variety of properties comprises, for example but not limited to, voltage, current, frequency, or duration, etc. In one or more embodiments, the comparator 14 may compare a variety of analog signals. In the single embodiment or in some embodiments, the variety of analog signals comprises, for example but not limited to, voltage signal(s), current signal(s), temporal information, or frequency information or signal(s).

In one or more embodiments, the comparator 14 may comprise a plurality of portions for respectively comparing a plurality of properties of the analog signals. For example, the comparator 14 may comprise two or more sub-comparators or comparator modules (hereinafter sub-comparators), wherein at least one of the sub-comparators may be used for comparing voltage signal(s) or information, and at least one other sub-comparators may be used for comparing current signal(s) or information. In some embodiments, the comparator 14 may comprise a single comparator module or sub-comparator, wherein the single sub-comparator is executed multiple times to determine whether the system response signal(s) falls within the allowable temporal range. For example, in these embodiments, the sub-comparator may be first executed to compare the timing information of the system response signal under test to a range defined by the nominal time and the upper bound and then executed to compare the timing information of the system response signal under test to another range defined by the nominal time and the lower bound.

In one or more embodiments, the circuit portion 12 to be tested comprises a mixed-mode circuit. In the single embodiment or in some embodiments, the mixed-mode circuit refers to a circuit that does not contain only a purely digital circuit or a purely analog circuit but comprises one or more digital portions and one or more analog portions. In one or more embodiments, the comparator 14 may comprise a plurality of portions for respectively comparing digital signals and analog signals.

Although various different embodiments, the scope is not limited thereto. One of ordinary skill in the art may combine various embodiments as described above or modify some or all of the elements according to the spirit of the embodiments. Therefore, the combination or modification of various embodiments of some or all of the elements in the embodiments is also deemed as falling within the scope.

In one or more embodiments, the comparator 14 may be an Exclusive OR (XOR) gate or an Exclusive Not OR (XNOR or NXOR) gate. In some embodiments, the XOR gate or the XNOR gate comprises at least two input ports (input port A and input port B) and at least one output port. The input port A and the input port B may be respectively used to receive the system response signal and the ideal response signal as input signals.

The following Table 1 represents a truth table of the XOR gate and the XNOR gate indicating a relation between the input ports and the output port.

TABLE 1

Truth table of XOR gate

| Input Port A | Input Port B | Output Port A XOR B |
|---|---|---|
| 0 | 0 | 0 |
| 0 | 1 | 1 |
| 1 | 0 | 1 |
| 1 | 1 | 0 |

Truth table of XNOR gate

| Input Port A | Input Port B | Output Port A XNOR B |
|---|---|---|
| 0 | 0 | 1 |
| 0 | 1 | 0 |
| 1 | 0 | 0 |
| 1 | 1 | 1 |

As can be seen from the above table, in some embodiments where the comparator 14 comprises the XOR gate, the XOR gate outputs a "logic 0" signal if the system response signal is identical to the ideal response signal. That is, outputs a correct signal. In some embodiments where the system response signal is different from the ideal response signal, the XOR gate outputs a "logic 1" signal. That is, the system outputs an error signal. In some embodiments where the comparator 14 comprises an XNOR gate, the XNOR gate outputs a "logic 1" signal if the system response signal is identical to the ideal response signal. That is, the system outputs a correct signal in these embodiments. In these embodiments, the XNOR gate outputs a "logic 0" signal if the system response signal is different from the ideal response signal. That is, the system outputs an error signal.

The comparator 14 may also compare one input signal or a plurality of input signals at the same time in the single embodiment or in some embodiments. In the single embodiment or in some embodiments where the comparator 14 compares a plurality of input signals at the same time, the comparator 14 may comprises a plurality of XOR gates and perform an OR operation on outputs of the plurality of the plurality of XOR gates. That is, the output result is a "logic 1" signal if any error occurs, and "logic 0" signal if no error occurs. In the one or more embodiments, the comparator 14 may comprise a plurality of XNOR gates and perform an AND operation on outputs of the plurality of XNOR gates. That is, the output result is a "logic 0" signal if any error occurs, and a "logic 1" signal if no error occurs.

Figure 7A:
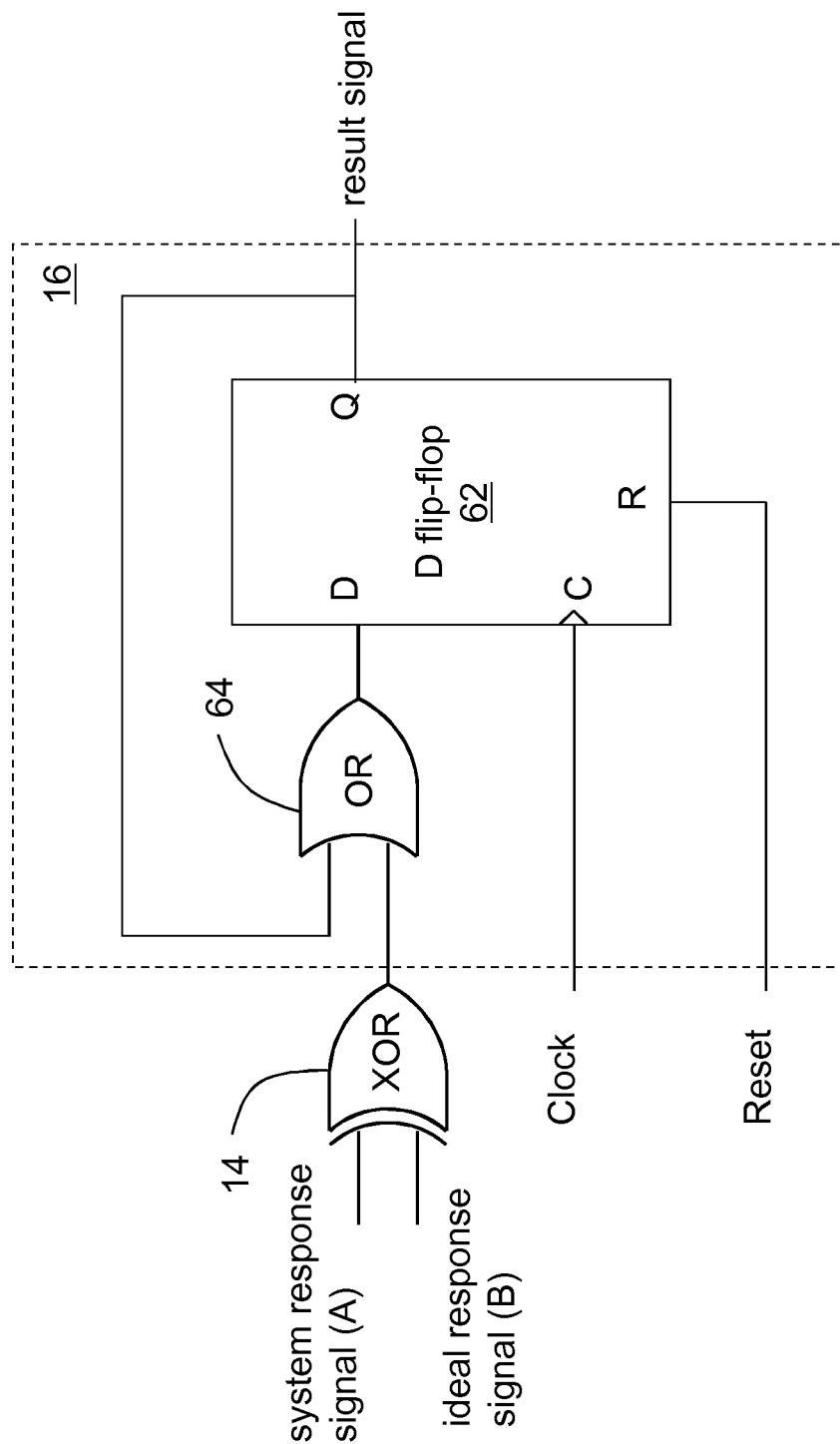
FIGS. 7A-B illustrate high level schematic diagrams for the comparison result recorder in some embodiments.

In the single embodiment or in some embodiments, the comparison result recorder 16 may comprise a circuit as illustrated in FIG. 7A. FIG. 7A comprises an exemplary circuit diagram of the comparison result recorder 16. The comparison result recorder 16 comprises a D flip-flop 62 and an OR gate 64 in some embodiments. The D flip-flop 62 comprises an input port D, an output port Q, a clock output port C, and a reset input port R. In the exemplary circuit, the comparison result recorder 16 may be operatively connected to the comparator 14. An XOR gate for realizing functions of the comparator 14 is used in this example. In this embodiment, a rising edge trigger D flip-flop is used. After a reset occurs, the output signal Q is reset to "logic 0".

After at least one clock rising edge trigger occurs, the output signal of the output port Q of the D flip-flop is a signal of the input port D when a previous clock rising edge trigger occurs in some embodiments. In these embodiments, a relation between the output port Q and the input port D may be shown by the following truth table as illustrated in Table 2.

TABLE 2

| Clock | D | Q | $Q_{prev}$ |
|---|---|---|---|
| Rising edge | 0 | 0 | X |
| Rising edge | 1 | 1 | X |
| Non-Rising | X | $Q_{prev}$ | |

In some other embodiments, the signal input by the input port A of the XOR gate comprises a system response signal, and A(t) represents a signal input by the port A at a $t^{th}$ rinsing edge trigger. The signal input by the input port B comprises an ideal response signal, and B(t) represents a signal input by the port B at the $t^{th}$ rinsing edge trigger. Q(t) represents an output signal of the output port Q of the D flip-flop before the $t^{th}$ rinsing edge trigger. In these embodiments, a relation of the circuit in FIG. 7A may be expressed as: $Q(t+1)=Q(t)+(A(t) \oplus B(t))$. In the preceding equation, the operator "+" represents an OR operation, and "$\oplus$" represents an XOR operation (an exclusive disjunction.) The relation may be shown by the following truth table as illustrated in Table 3.

TABLE 3

| Q(t) | A(t) | B(t) | Q(t + 1) |
|---|---|---|---|
| 0 | 0 | 0 | 0 |
| 0 | 0 | 1 | 1 |
| 0 | 1 | 0 | 1 |
| 0 | 1 | 1 | 0 |
| 1 | 0 | 0 | 1 |
| 1 | 0 | 1 | 1 |
| 1 | 1 | 0 | 1 |
| 1 | 1 | 1 | 1 |

As it may be seen from the above table, only when the output signal Q(t) of the output port Q is "logic 0", and A(t) is identical to B(t), will the output signal Q(t+1) of the output port Q at a next time be "logic 0". Accordingly, if Q(t) is "logic 0", it may be determined that Q(t−1) is also "logic 0". Therefore, only when no error occurs after the time when the D flip-flop 62 is reset and till the $t^{th}$ rinsing edge trigger, will the output Q(t+1) of the D flip-flop 62 be "logic 0". In other cases, if A(t) is different from B(t), Q(t) is "logic 1".

Figure 7B:
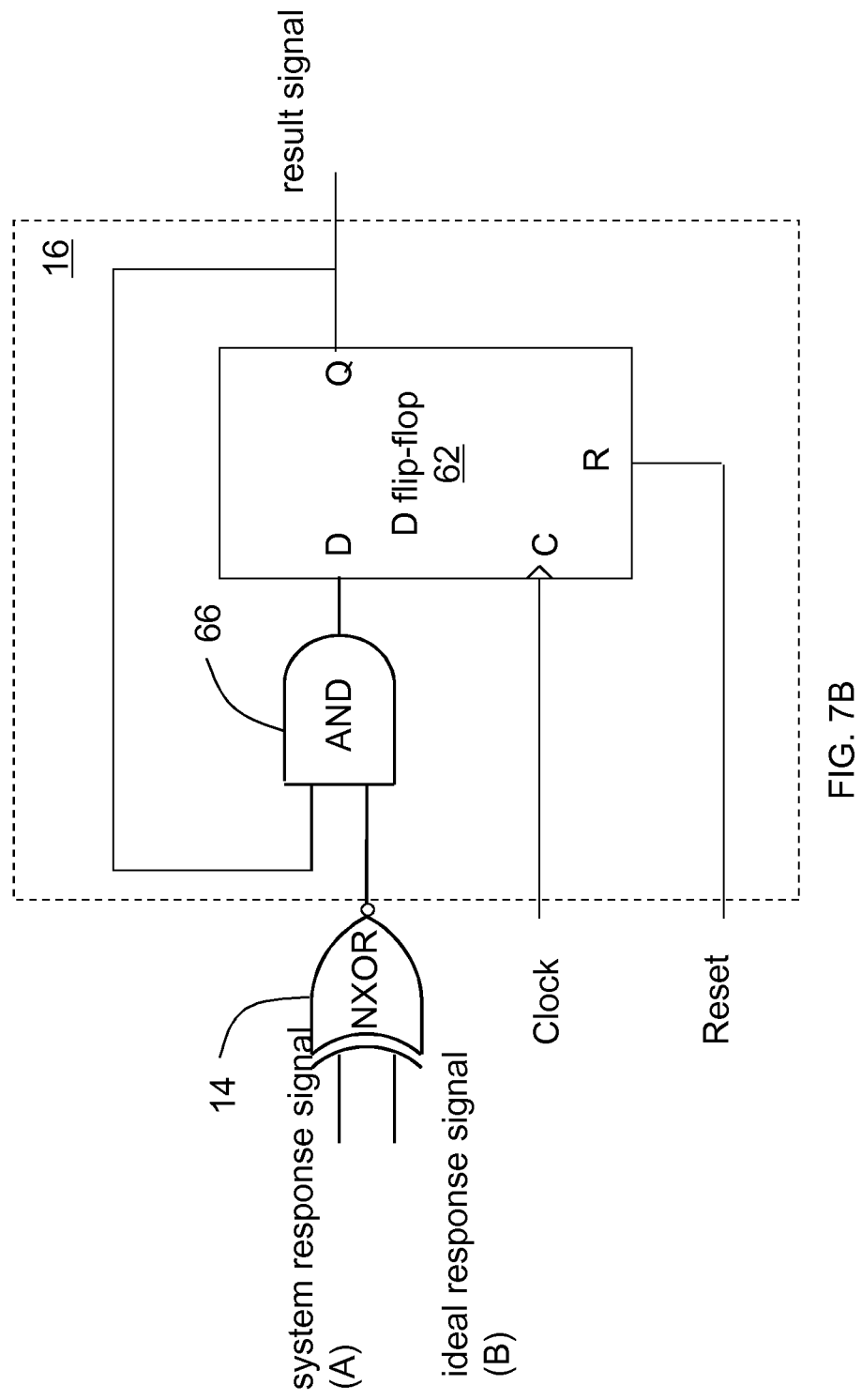

In addition to the circuit in FIG. 7A, the comparison result recorder 16 may also be formed by a circuit in FIG. 7B in some embodiments. The comparison result recorder 16 comprises a D flip-flop 62 and an AND gate 66. In the exemplary circuit, the comparison result recorder 16 is operatively connected to the comparator 14. In addition, the comparator 14 is an XNOR gate in these embodiments as illustrated in FIG. 7B.

A relation of the circuit in FIG. 7B may be expressed as: $Q(t+1)=Q(t) \wedge \overline{(A(t) \oplus B(t))}$ (A(t) B(t)). "$\wedge$" represents an AND operation (a logical conjunction), and "$\overline{(A(t) \oplus B(t))}$" represents an XNOR operation between A(t) and B(t). The relation may be shown by the following truth table as illustrated in Table 4.

TABLE 4

| Q(t) | A(t) | B(t) | Q(t + 1) |
|---|---|---|---|
| 0 | 0 | 0 | 0 |
| 0 | 0 | 1 | 0 |
| 0 | 1 | 0 | 0 |
| 0 | 1 | 1 | 0 |
| 1 | 0 | 0 | 1 |
| 1 | 0 | 1 | 0 |

TABLE 4-continued

| Q(t) | A(t) | B(t) | Q(t + 1) |
|------|------|------|----------|
| 1    | 1    | 0    | 0        |
| 1    | 1    | 1    | 1        |

As it may be seen from the above table, only when the output signal Q(t) of the output port Q is "logic 1", and A(t) is identical to B(t), will the output signal Q(t+1) of the output port Q at a next time be "logic 1". Accordingly, if Q(t) is "logic 1", it may be determined that Q(t−1) is also "logic 1". In these cases, only when no error occurs after the time when the D flip-flop 62 is reset and till the $t^{th}$ rinsing edge trigger, will the output Q(t+1) of the D flip-flop 62 be "logic 1". In other cases, if A(t) is different from B(t), Q(t) is "logic 0".

With the exemplary circuits as shown in FIG. 7A or 7B, the comparison result recorder 16 may record whether an error occurs within a time period.

Although the structure of the comparison result recorder 16 is described above through examples, various embodiments are not limited thereto. Persons skilled in the art may also devise similar comparison result recorder 16 by using other elements so as to realize identical or substantially similar functions such as recording comparison results. In one or more embodiments, the comparison result recorder 16 may comprise a non-volatile memory so the error comparison circuit 10 may still retain the comparison result, which is obtain before the power is shut off, even after the power is shut off.

The exemplary circuits in FIG. 7A or 7B provide a simplified illustration for an embodiment of the comparison result recorder 16 for the ease of illustration and explanation. The exemplary circuits of these embodiments provide a recorder for storing bit-by-bit comparison results. Persons skilled in the art may also device a similar comparison result recorder 16 by using other elements so as to record more complex comparison results without departing from the spirit of various embodiments disclosed herein.

In one or more embodiments, the comparison result recorder 16 may record a comparison result of a plurality of bits.

In one or more embodiments, the comparison result recorder 16 may receive location information from the test instrument 90 indicating which part(s) of the circuits is (are) being tested and may thus record the location at which a particular comparison is conducted together with the comparison results.

In one or more embodiments, the comparison result recorder 16 may receive information about one or more test items from the test instrument 90 while receiving comparison results at substantially the same time and thus record the one or more test items for which a comparison is conducted. In the single embodiment or in some embodiments, the one or more test items comprise one or more of a test on a portion of the circuit under test, a memory test, a read and/or write test, a high speed test, a high temperature test, a combination of any of the aforementioned tests, or any other tests of the portion of the circuit under test. One of ordinary skill in the art will clearly understand that even though receiving comparison results and receiving information about one or more test items are designed or intended to occur at the same time, they may not necessarily occur at exactly the same time due to various factors such as various delays in signal transmission, etc. In these embodiments, the method or the system may then correspond the comparison results received to more precise point(s) in the test item based at least in part upon the information about the one or more test items so as to precise locate which part(s) of a test item causes the comparison results.

In the one or more embodiments, the error comparison circuit 10 may be located on a semiconductor substrate. In these embodiments, the circuit portion 12 to be tested or the memory 22, the comparator 14, and the comparison result recorder 16 are located on a semiconductor substrate.

A semiconductor substrate may be divided into a chip area and a dicing area. The chip area comprises an area that will be retained after dicing for die preparation. The dicing area comprises an area on the semiconductor substrate that is not the chip area.

Figure 8A:
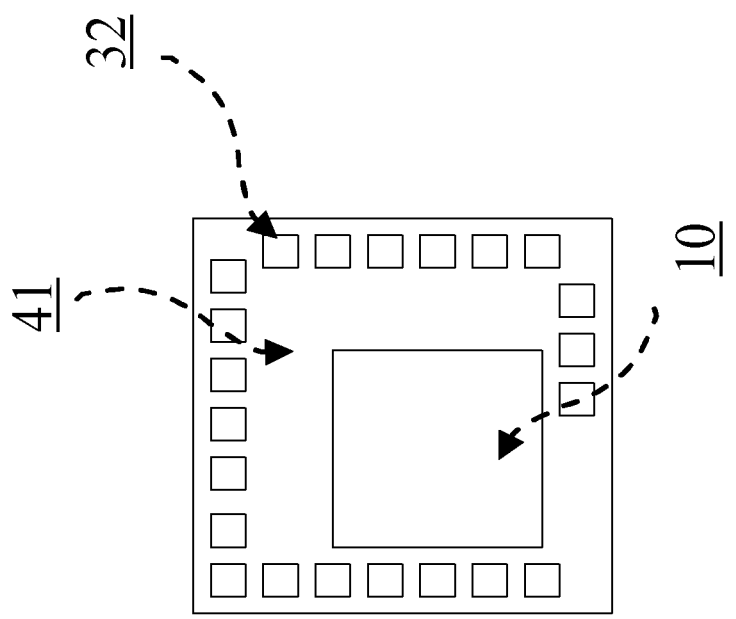
FIGS. 8A-E illustrate schematic configurations of various systems for testing electronic circuits on semiconductor substrates.

FIG. 8A illustrates a schematic view of a first exemplary configuration on a semiconductor substrate. In the first exemplary configuration, the error comparison circuit 10 may be located in the chip area 41 in some embodiments. In addition or in the alternative, the chip area 41 further comprises a plurality of bonding pads 32. The plurality of bonding pads 32 comprises a plurality of metal interfaces that may be electrically connected with an external interface after a chip is packaged. At least one of the bonding pads 32 may be electrically connected to the error comparison circuit 10 in some embodiments. The test instrument 90 described in FIG. 1 may use one or more probes to connect to one or more of the plurality of bonding pads 32 and transfer the test signal(s) and the ideal response signal(s) to the error comparison circuit 10 through the one or more probes.

Figure 8B:
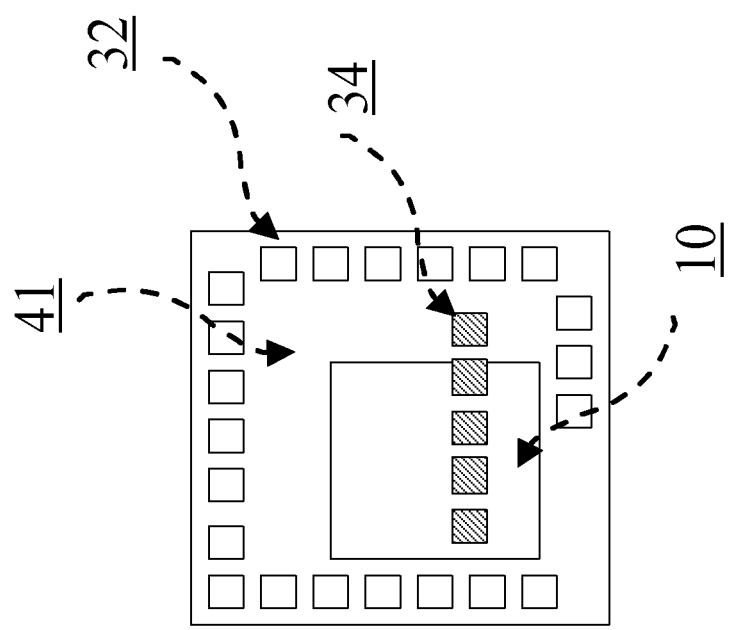

FIG. 8B illustrates a schematic view of a second configuration on a semiconductor substrate. In the second exemplary configuration, the error comparison circuit 10 may be located in the chip area 41. In order to reduce the risk that the probe may cause damage to one or more of the plurality of bonding pads or bump pads 32 during test, the chip area 41 may further comprise a plurality of testing pads 34. The plurality of testing pads 34 may be dedicated to probe-testing but not for wire bonding or for establishing external connection(s) outside a packaged or an unpackaged (e.g., a flip chip) electronic circuit in some embodiments. The plurality of testing pads 34 may be located in the chip area 41. The plurality of testing pads 34 are electrically connected to the error comparison circuit 10 in the single embodiment or in some embodiments. The test instrument 90 may use one or more probes to connect to one or more of the plurality of testing pads 34 and transfer the test signal(s) and the ideal response signal(s) to the error comparison circuit 10 through the one or more probes. In some other embodiments, rather than connecting the system for testing electronic circuits via a plurality of testing pads, the system for testing electronic circuits 10 may be connected to the test instrument 90 by using at least one bump pad or at least one bonding pad.

Figure 8C:
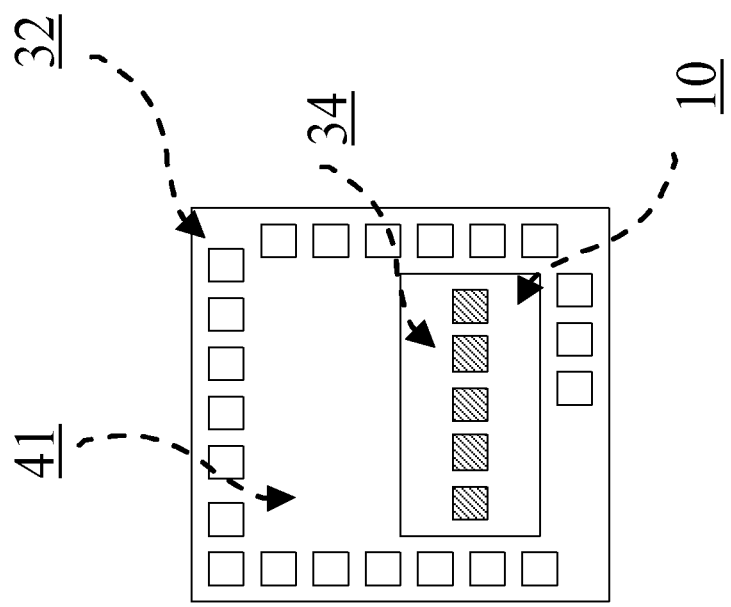

FIG. 8C illustrates a schematic view of a third exemplary configuration on a semiconductor substrate in some embodiments. In the third exemplary configuration, the error comparison circuit 10 may be located in the chip area 41, and the testing pads 34 are located in the error comparison circuit 10. In this exemplary configuration, the error comparison circuit 10 and the plurality of testing pads 34 may be considered as a hard-macro when laying out a circuit. In these embodiments, this exemplary configuration may be easily embedded into a common circuit design. In these embodiments, the physical design of this exemplary configuration may be predefined and regarded as the intellectual property by the manufacturer.

Figure 8D:
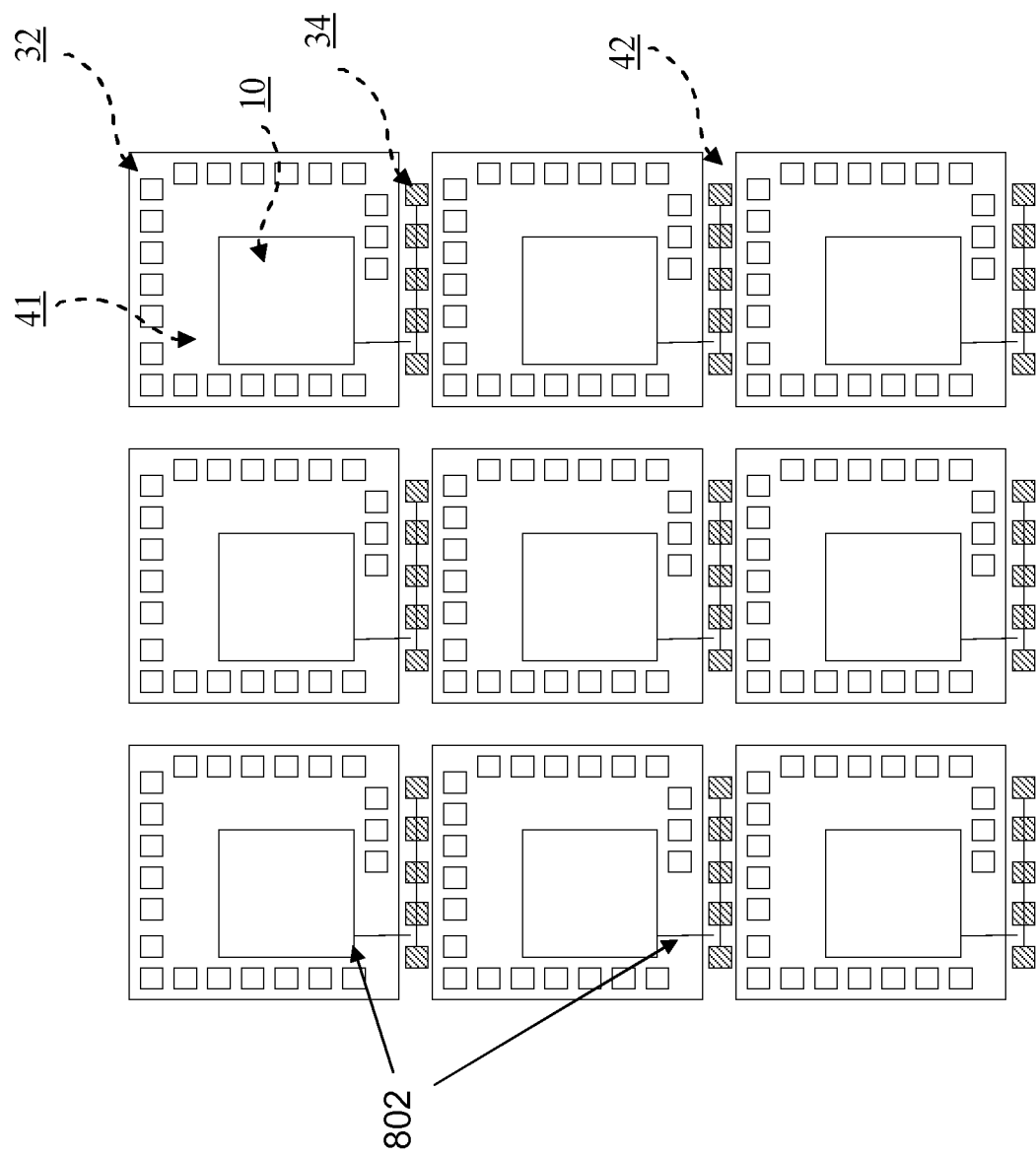

FIG. 8D illustrates a schematic view of a fourth exemplary configuration on a semiconductor substrate. In the fourth exemplary configuration, the error comparison circuit 10 may be located within the chip area 41, and the plurality of testing pads 34 may be located in the dicing area 42 in some embodiments. Because the plurality of testing pads 34 are not used for wire bonding during IC packaging or for electrically connecting the chips to external circuits or interfaces after the chips are separated, the plurality of testing pads 34 may be sacrificed during chip dicing. In these embodiments as illustrated in FIG. 8D, each of the chips on the semiconductor substrate corresponds to its own system for testing electronic circuits 10 which interfaces with the test equipment 90 (not shown) via a plurality of testing pads 34 and a bus 802. In these embodiments, the bus 802 may comprise a serial bus, a parallel bus, or a combination thereof to carry data and is used to transmit and receive signals and information such as the testing information in FIG. 1C.

In one or more embodiments, the plurality of testing pads 34 may be located in the dicing area 42, and the plurality of testing pads 34 connected to the same chip may be located on the same side of the chip area 41 so as to optimize space utilization. In some embodiments, a test probe may be used to contact a plurality of testing pads 34. In the other direction of the dicing area 42, for example, a longitudinal direction in FIG. 8D, testing lines may be disposed. If the plurality of testing pads 34 connected to the same chip are not located on the same side of the chip area 41, the distance between chips may need to be increased during chip configuration so as to dispose the testing pads 34 required. One of ordinary skill in the art clearly understands that other design choices do not depart from the spirit of various embodiments in terms of the design principles but may occupy a large area in practical applications. In some embodiments, at least a portion of the system for testing electronic circuits 10 is located in the dicing area 42.

Figure 8E:
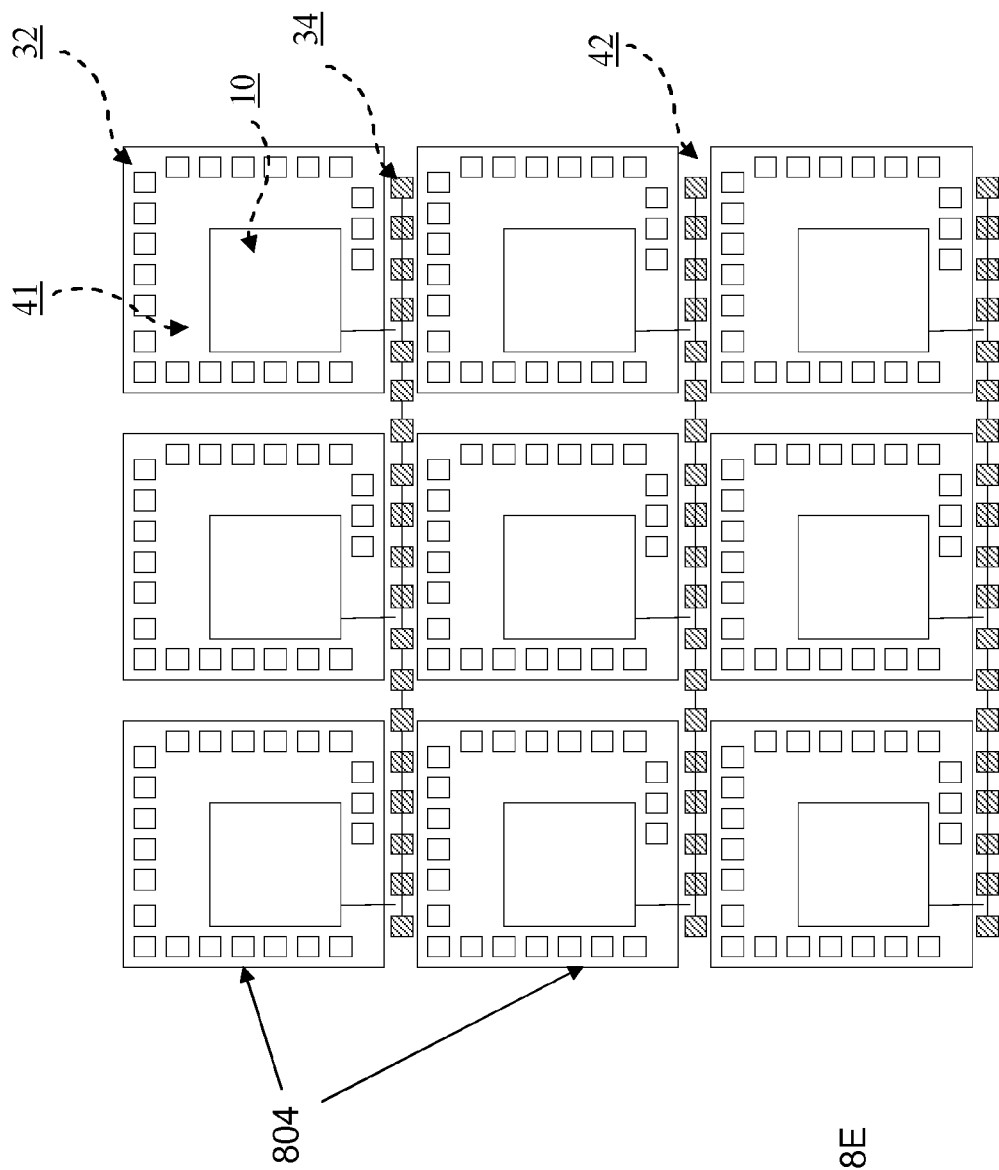

FIG. 8E illustrates a schematic view of another exemplary configuration on a semiconductor substrate. A set of testing pads 34 may be located in the dicing area 42 in some embodiments. The set of testing pads 34 may be operatively connected to a plurality of error comparison circuit 10. For example, as shown in FIG. 8E, a set of testing pads 34 are connected to four chip areas 41 in the illustrated exemplary configuration. Moreover, each error comparison circuit 10 is located in the chip area 41 in these embodiments. In this exemplary configuration, a chip may comprise an address decoder (not shown) and a switch module (not shown) disposed therein in some embodiments. The switch module selectively electrically connects the testing pads 34 to the error comparison circuit 10. The test instrument 90 may transmit an address signal to the address decoder through the probe. The address decoder may transmit a corresponding control signal to one of the switch modules according to the address signal. In the single embodiment or in some embodiments, the test signal comprises the address signal or the control signal. The switch module receiving the control signal is actuated and thus enables the testing pads 34 to be electrically connected to the error comparison circuit 10 corresponding to the switch module. In these embodiments, the probe of the test instrument 90 transmits the test signal and the ideal response signal to the error comparison circuit 10 based at least in part upon the address signal. In these embodiments as illustrated in FIG. 8E, the testing pads 34 are operatively connected to the corresponding system for testing electronic circuits 10 in a plurality of chips via respective buses 804. In these embodiments, the testing pads for operatively connecting a plurality of chips (and hence a plurality of system for testing electronic circuits 10) may be further connected to a switch or a multiplexer (MUX) as described above to determine which test signals are to be transmitted to which chips and which test result signals come from which chip. In shall be noted that in FIGS. 8A-E, the system for testing electronic circuits 10 is located within the chip area 41 in some embodiments. Nonetheless, the system for testing electronic circuits 10 may also be located in some other areas, such as in the dicing areas of a semiconductor substrate, in some embodiments.

Although the error comparison circuit 10 is disposed on a semiconductor substrate, various embodiments are not limited thereto. In some embodiments, the error comparison circuit 10 may also be disposed on a printed circuit board (PCB) or various other substrates.

Figure 12:
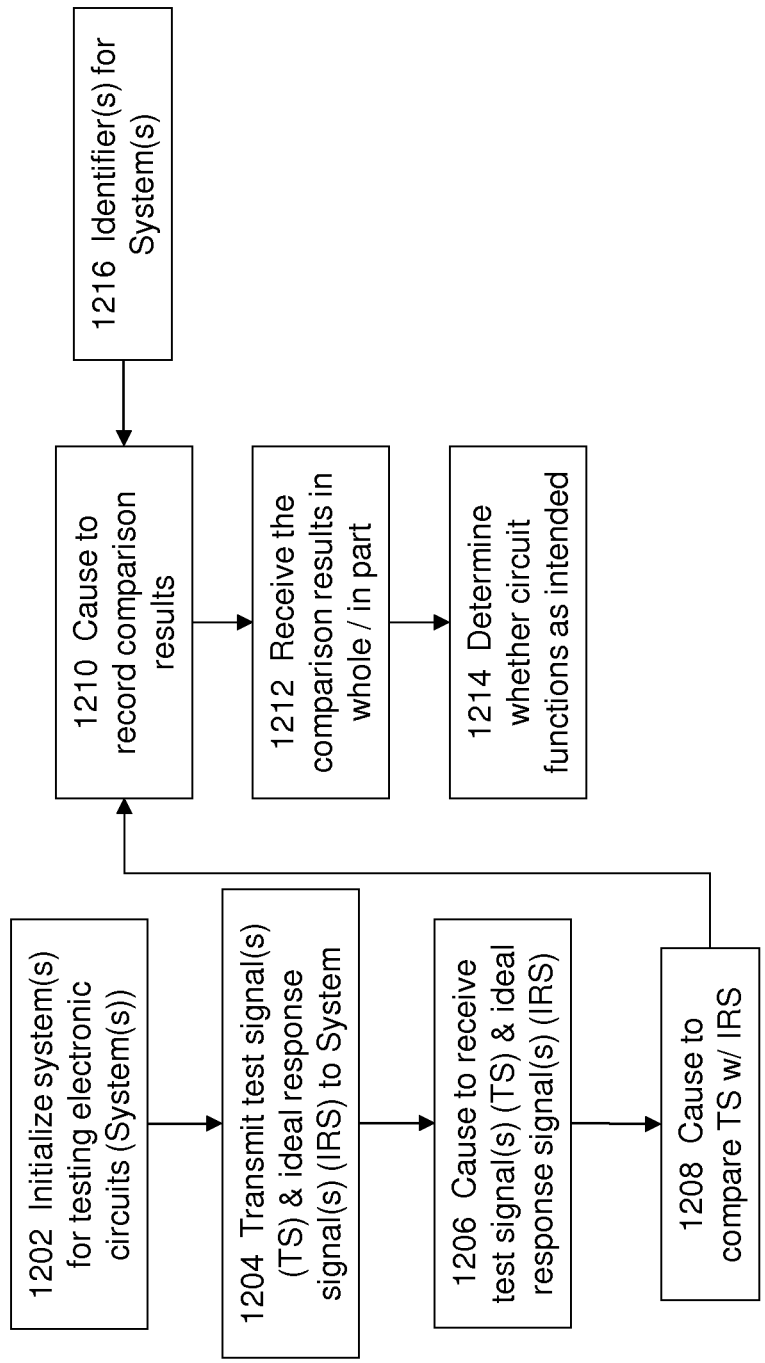
FIG. 12 illustrates a high level block diagram for a method for testing electronic circuits in some embodiments.

In addition to the various circuit structures and circuit configurations described above, some embodiments further provide a method for testing electronic circuits with an error comparison circuit. FIG. 12 illustrates a high level block diagram of a method for testing an electronic circuit according to one or more embodiments. It shall be noted that various embodiments that are described above with reference to the systems may also apply to the method described below to the extent that such various embodiments described above with reference to the systems may also apply to the method for testing electronic circuits.

At 1202, the method for testing electronic circuits comprises initializing one or more systems for testing electronic circuits in a single embodiment or in some embodiments. In some embodiments, the act of initializing one or more systems for testing electronic circuits comprise power on the electronic circuit(s) under test, resetting the comparison result recorder(s) if needed or desired, or resetting the electronic circuit(s) under test if needed or desired. At 1204, the method for testing electronic circuits comprises transmitting one or more test signals, test patterns, or test vectors (hereinafter test signal) and the corresponding one or more ideal response signals to the one or more system for testing electronic circuits in the single embodiment or in some embodiments. At 1206, the method for testing electronic circuits comprises causing the one or more system for testing electronic circuits to receive the one or more test signals and the one or more ideal response signals in the single embodiment or in some embodiments.

At 1208, the method for testing electronic circuits comprises causing the one or more system for testing electronic circuits to compare the one or more test signals with the corresponding one or more ideal response signals in the single embodiment or in some embodiments. At 1210, the method for testing electronic circuits comprises causing the one or more system for testing electronic circuits to record at least a part of the result(s) of the act of comparing the one or more test signals with the corresponding one or more ideal response signals. In some embodiments where multiple system for testing electronic circuits are used such as illustrated in FIG. 2B, the method for testing electronic circuits comprises receiving a plurality of error comparison identifiers (1216) for the act of 1210 where at least the identifiers are used to attribute the recorded comparison result(s) to the corresponding system for testing electronic circuits.

At 1212, the method for testing electronic circuits comprises receiving the recorded comparison result(s) in whole or in part in the single embodiment or in some embodiments. At 1214, the method for testing electronic circuits comprises determining whether the electronic circuit under test functions as intended or designed based at least in part upon the received results at 1212 in the single embodiment or in some embodiments.

Figure 13:
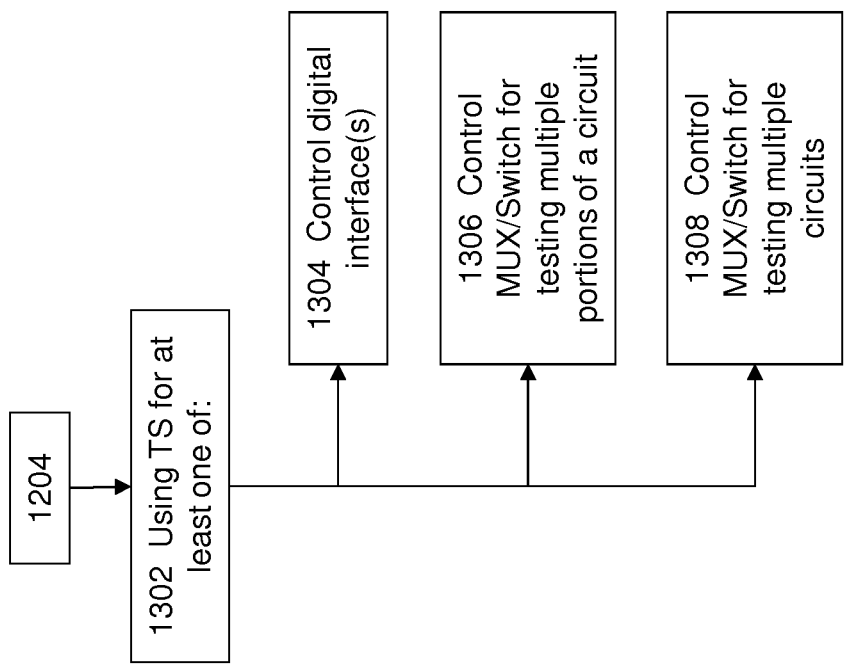
FIG. 13 illustrates further details of an act of using the test signal(s) for various purposes in some embodiments.

Referring to FIG. 13, which illustrates further details of an act of using the test signal(s) for various purposes in some embodiments. Once at least one of the one or more signals is transmitted to the one or more system for testing electronic circuits, the method for testing electronic circuits may further optionally comprise using the at least one test signal (1302) for at least one of 1304, 1306, or 1308. The method may use the at least one test signals for controlling one or more digital interfaces (1304). The method may use the at least one test signals for controlling a multiplexer, a switch, or a selector for testing multiple portions of a circuit (1306). The method may use the at least one test signals for controlling a multiplexer, a switch, or a selector for testing multiple electronic circuits.

FIGS. 14A-D illustrate examples of time-interleaved test signals and ideal response signals that may be transmitted from, for example, an external test equipment that is remotely situated to the electronic circuits to be tested to electronic circuits in some embodiments. In these figures, each hexagon represents one bit of signal (e.g., a test signal or an ideal response signal) in FIGS. 14A-D although the one-bit representation shall not be considered as limiting the scope of the claims or the scope of using other representations, unless otherwise specifically recited or claimed. For example, the time-interleaved signal may be transmitted from an external test equipment to a digital interface of an electronic circuit to be tested. In some embodiments, a time-interleaved signal may include a series of repetitive patterns of signals, wherein each of the pattern includes a test signal of a first length followed by an ideal response signal of a second length, and the pattern repeats itself for a total number of times depending at least in part upon the total test signals and the total ideal response signals.

Figure 14A:
FIGS. 14A-D illustrate some examples of time-interleaved test signals and ideal response signals that may be transmitted from, for example, an external test equipment that is remotely situated to the electronic circuits to be tested to electronic circuits in some embodiments.
Figure 14B:

In these embodiments, the first length of the test signal may be identical to or different from the second length of the ideal response signal. For example, either length of the first length and the second length may include one bit, multiple bits, one byte, multiple bytes, one word, multiple words, or any other lengths. For example, FIG. 14A illustrates a series of repeating patterns, where each pattern a test signal (denoted by "T" in FIG. 14B) having a first length of one bit time interleaved and thus followed by an ideal response signal (denoted by "I" in FIG. 14B) having a second length of one bit. FIG. 14B illustrates a series of repeating patterns, where each pattern includes a test signal (denoted by "T" in FIG. 14B) having a first length of eight bits time interleaved and thus followed by an ideal response signal (denoted by "I" in FIG. 14B) having a second length of eight bits.

Figure 14C:
Figure 14D:

FIG. 14C illustrates a series of repeating patterns, where each pattern includes a test signal (denoted by "T" in FIG. 14C) having a first length of two bits time interleaved and thus followed by an ideal response signal (denoted by "I" in FIG. 14C) having a second length of three bits. FIG. 14D illustrates two series of time-interleaved repeating patterns, where the first repeating pattern prior to a time point "Time A" includes a test signal (denoted by "T" in FIG. 14D) having a first length of two bits time interleaved and thus followed by an ideal response signal (denoted by "I" in FIG. 14D) having a second length of two bits. At the time point "Time A", the first series of repeating patterns is followed by a second series of repeating patterns, where each pattern in the second series of repeating patterns includes a test signal (denoted by "T" in FIG. 14D) having a first length of one bit time interleaved and thus followed by an ideal response signal (denoted by "I" in FIG. 14D) having a second length of one bit.

It shall be noted that more than two series of patterns of test signals and ideal response signals having variable lengths may also be time interleaved, rather than just two series of time interleaved patterns as illustrated in FIG. 14D. It shall be noted that although FIGS. 14A-D illustrated at least a portion of a test signal is time-interleaved with at least a portion of an ideal response signal, the test signal is not always required to be interleaved with the ideal response signal. In other words, a portion of a test signal may be time-interleaved with a portion of an ideal response signal during a first period of time, while only the test signal or a portion thereof (or the ideal response signal or a portion thereof) is transmitted during another period of time without being time-interleaved with an ideal response signal or a portion there of (or a test signal or a portion thereof). The combination of multiple series of repeating patterns illustrated in FIG. 14D may be configured and used to achieve the desired sequence of signal transmission.

In some embodiments, signal transmissions or communication may reference a clock signal to trigger the transmission or communication of the signals. FIGS. 15A-B illustrate two examples of transmitting time interleaved test signals and ideal response signals using a clock signal. More specifically, FIG. 15A illustrates an example where the signals 1500A including the test signals (denoted by "T" in FIG. 15A) time-interleaved with the ideal response signals (denoted by "I" in FIG. 15A) are transmitted from, for example, an external, remotely located test equipment to, for example, an electronic circuit to be tested at the rising edges (e.g., 1512A or 1516A) of the clock signal 1510A. In this example, the first test signal having a length of one bit is transmitted to the electronic circuit to be tested on the rising edge 1512A.

The test signal is held steady within a period of time including the time point of the rising edge 1512A. In this illustrated example, the test signal is held steady between 1502A and 1504A, and the rising edge 1512A that triggers the transmission of the one-bit test signal falls within the period corresponding to 1502A and 1504A. In addition, FIG. 15A also illustrates that the transmission of the ideal response signals (denoted by "I") is also triggered by the rising edges of the clock signal (e.g., 1516A). In this illustrated example, the one-bit ideal response signal is also held steady between 1506A and 1508A, and the next rising edge 1516A triggering the transmission of the ideal response signal also falls within the period corresponding to 1506A and 1508A. In some embodiments, the amount of time a data signal (e.g., 1500A) is held steady may be determined based at least in part upon, for example but not limited to, the setup time and/or the hold time.

For example, the minimum amount of time during which the synchronous data signal to, for example, a flip-flop is to be held steady may be the time period from the setup time to the hold time, where both the setup time and the hold time are dependent upon the clock signal. The setup time represents the minimum amount of time during which a signal is to be held stead before the clock event or the triggering event (e.g., a rising edge, a falling edge, etc.) such that the data are reliably sampled by the clock. The hold time represents the minimum amount of time during which a signal is to be held steady after the clock event or the triggering event (e.g., a rising edge, a falling edge, etc.) In some embodiments, the time period during which the signals (e.g., 1500A) are to be held steady may be determined based at least in part upon the recovery time and/or the removal time. A recovery time indicates the time period between the time when an asynchronous signal goes inactive and an active clock edge, and a removal time represents the time period between an active clock edge and the time point when an asynchronous signal goes inactive in some embodiments.

FIG. 15B illustrates another example where the signals 1500B including a portion of test signals (denoted by "T" in FIG. 15B) time-interleaved with a portion of the ideal response signal (denoted by "I" in FIG. 15B). Each portion of the test signal (denoted by "T" in FIG. 15B) and each portion of the ideal response signal (denoted by "I" in FIG. 15B) has a length of one bit for ease of illustration and explanation purposes in FIG. 15B. The transmission of the signal 1500B is coordinated with a clock signal 1510B having rising edges (e.g., 1512B) and falling edges (e.g., 1514B). In this example, the transmission of a portion of the test signal may be triggered by the rising edge of the clock signal (e.g., rising edge 1512B), and the transmission of a portion of the ideal response signal may be triggered by the falling edge (e.g., 1514B) of the clock signal. In this illustrated example, the test signal is held steady between 1502B and 1504B, and the rising edge 1512B that triggers the transmission of the one-bit test signal falls within the period corresponding to 1502B and 1504B. Moreover, the one-bit ideal response signal is also held steady between 1506B and 1508B, and the falling edge 1514B triggering the transmission of the ideal response signal also falls within the period corresponding to 1506B and 1508B.

In some embodiments, at least a part of the test signal and at least a part of the ideal response signal are devised to transmit through the same single physical channel in a time-interleaved manner. In these embodiments, the system may utilize a single physical channel, rather than multiple physical channels, to transmit the test signals as well as the ideal response signal and thus simplify the design of the electronic circuit to be tested. For example, the interface (e.g., the digital interface 18) of an electronic circuit to be tested may need to accommodate a single physical channel, instead of multiple ones, to receive test signals and ideal response signals. Moreover, having fewer number of physical channels for transmitting the test signals and the ideal response signals results in fewer number of pins, pads, or terminals at the external test equipment (e.g., external test equipment 90), at the electronic circuit (e.g., electronic circuit 10), or both. Another advantage of utilizing a single physical channel is that valuable space on the semiconductor substrate on which the electronic circuit to be tested is situated may be preserved due to the simplified interface design.

In some of these embodiments, the first length of a portion of the test signal may be identical to or different from the second length of a portion of the ideal response signal that is to be time-interleaved with the portion of the test signal. In addition or in the alternative, the first length, the second length, or both the first length and the second length may be reconfigured to assume different values at any time during a test. One of the advantages of utilizing a single physical channel for transmitting at least a portion of the test signal and at least a portion of the ideal response signal is that the likelihood of having interference (e.g., electromagnetic interference or EMI, co-channel interference or CCI, etc.) among the various signals (e.g., among signals transmitted within one of or between the external test equipment 90 and the electronic circuit under test within the system for testing electronic circuits 10, etc.) may be reduced. It shall be noted that the mention of a single physical channel for transmission of the test signals and the ideal response signals in some embodiments does not preclude the use of multiple physical channels for transmission of the test signals and the ideal response in some other embodiments.

In some embodiments, the signals such as signals 1500A or 1500B may be transmitted with one or more binary codes which may be modulated and include but not limited to analog modulation signals, digital modulation signals, spread spectrum signals, Digital multi-carrier modulation signals, a digital baseband modulation or digital base band transmission code, or any combinations thereof. Analog modulation signals may include, for example but not limited to, amplitude modulation (AM) signals, frequency modulation (FM) signals, phase modulation (PM), quadrature amplitude modulation (QAM), space modulation (SM) signals, single-sideband modulation (SSM) signals. Digital modulation signals may include but not limited to amplitude-shift keying (ASK), amplitude and phase-shift keying (APSK), continuous phase modulation signals (CPM), frequency-shift keying (FSK), multiple frequency-shift keying (MFSK), minimum-shift keying (MSK), on-off keying (OOK), pulse-position modulation (PPM), phase-shift keying (PSK), quadrature amplitude modulation (QAM) signals, single-carrier frequency-division multiple access (SC-FDE) signals, trellis modulation (TCM) signals, etc.

Spread spectrum signals may include but not limited to chirp spread spectrum (CSS) signals, direct-sequence spread spectrum (DSSS) signals, frequency-hopping spread spectrum (FHSS) signals, time-hopping spread spectrum (THSS) signals, etc. Digital multi-carrier modulation signals may include but not limited to orthogonal frequency-division multiplexing (OFDM), coded OFDM (COFDM) signals, discrete multi-tone modulation (DMT) signals, etc. A digital baseband modulation or digital base band transmission code may include, but not limited to, non-return-to-zero (NRZ) code, unipolar NRZ, bipolar NRZ, return-to-zero (RZ) code, etc.

A non-return-to-zero (NRZ) code is also knows as an NRZ line code which is a binary code where 1s are represented by one significant condition (e.g., some positive voltage) or 0s are represented by some other significant condition (e.g., some negative voltage). A unipolar NRZ is a binary code where 1s transition or remain high on the trailing clock edge of the previous bit and are represented by a physical level (e.g., a DC or direct current bias on the transmission line) or the opposite, and 0s transition or remain low on the trailing clock edge of the previous bit and are represented by another physical level (e.g., a negative voltage on the transmission line) or the opposite. A bipolar NRZ swings from positive to negative on the trailing edge of the previous bit clock cycle and is a binary code where 1s are represented by one physical level (e.g., a positive voltage), and 0s are represented by another physical level (e.g., a negative voltage). A return-to-zero (RZ) code includes a line code where the signal returns to zero between each change in a characteristic (e.g., amplitude) of the signal from a base value to a higher or lower value and then back to the base value. An amplitude modulation signal includes a signal obtained by varying the continuous wave carrier signal with an information-bearing modulation waveform for the carrier wave to carry the information.

In some of the embodiments, a signal including at least a portion of a test signal and a portion of an ideal response signal may be protected with and thus include code incorporating one or more error detection or correction schemes. The code incorporating one or more error detection or correction schemes may include, for example but not limited to, repetition codes repeating some bits across a physical channel to achieve error-free transmission, one or more parity bits, one or more checksums, one or more CRCs (cyclic redundancy checks), one or more hash functions (e.g., cryptographic hash functions), one or more error-correcting codes (ECC) for error detection, forward error correction (FEC), automatic repeat request (ARQ), one or more hybrid schemes (e.g., a hybrid scheme of ARQ and FEC), or any combination thereof. In an example where ECC is employed, the signals (e.g., 1500A or 1500B) used by the comparator described herein for testing electronic circuits (e.g., electronic circuits 10 in FIG. 1A-C, 2A-B, 3-6, 8A-E, or 16) to achieve a better signal integrity. One of the advantages of including the code incorporating one or more error detection or correction schemes is that the integrity of signal integrity may be improved.

In some embodiments, multiple electronic circuits under test (e.g., electronic circuit 10) may be tested in parallel. In some of these embodiments, at least a portion of the test signal and at least a portion of the ideal response signal may be transmitted through a single physical channel in a time-interleaved manner as described above from an external test equipment (e.g., test equipment 90) to an electronic circuit under test (e.g., electronic circuit 10) at least during one or more time periods throughout the entire duration of the test of the electronic circuit. In some other embodiments, the entire test signal and ideal response signal are transmitted from an external test equipment through a single physical channel to an interface of an electronic circuit under test throughout the entire duration of the test of the electronic circuit. In these embodiments where a single physical channel is used to transmit at least a portion of the test signal and at least a portion of the ideal response signal during one or more periods of time or throughout the entire duration of the test, electromagnetic interferences It shall be noted that the mention of a single physical channel for transmission of the test signals and the ideal response signals in some embodiments does not preclude the use of multiple physical channels for transmission of the test signals and the ideal response in some other embodiments.

Figure 16:
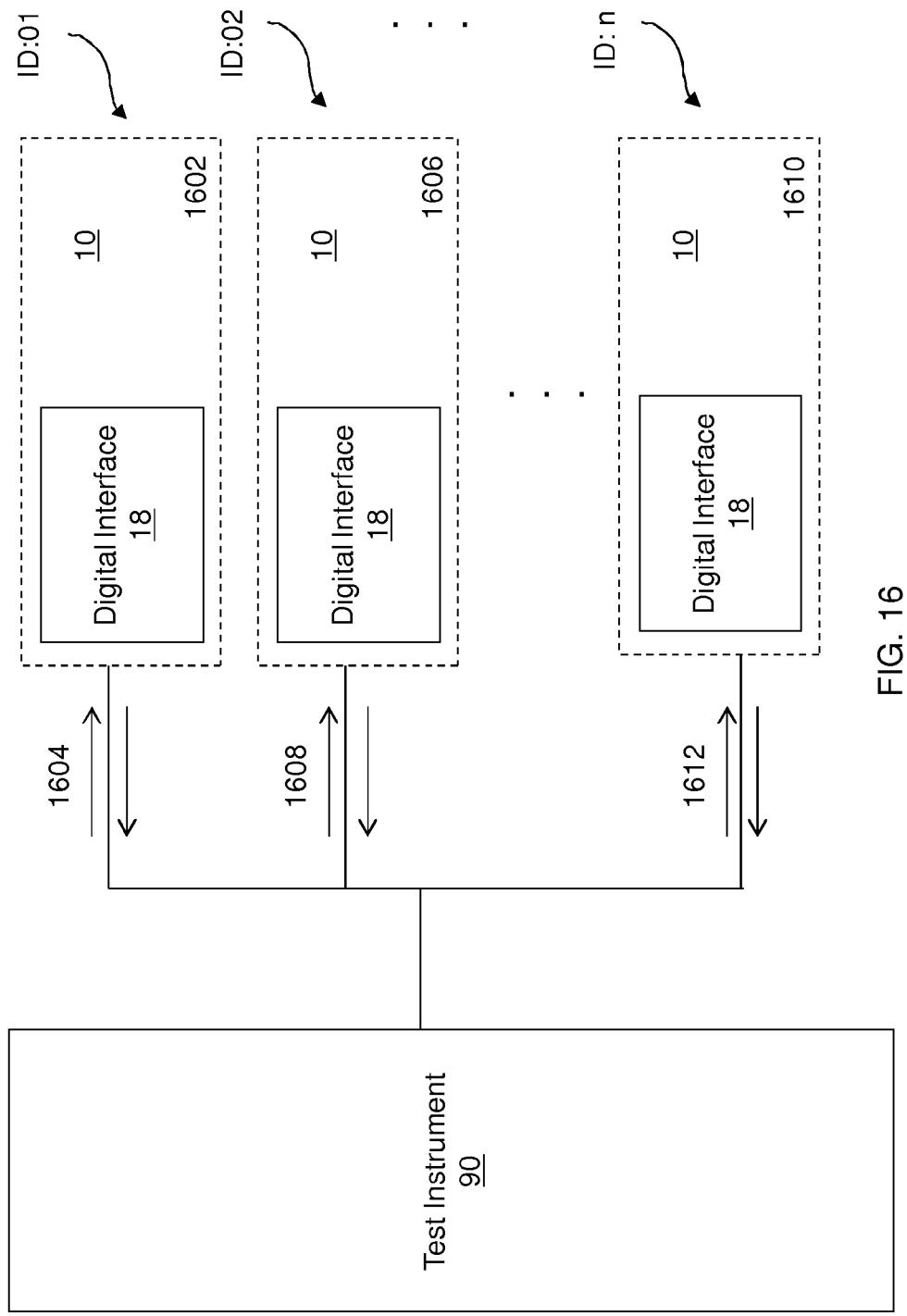
FIG. 16 illustrates an example of testing multiple electronic circuits 10 in parallel.

FIG. 16 illustrates an example of testing multiple electronic circuits 10 in parallel. In some embodiments, each of multiple systems for testing electronic circuits 10 may be connected to the test instrument 90 through its corresponding digital interface 18 as illustrated in FIG. 16. In the alternative, the multiple systems for testing electronic circuits 10 may be connected to a common, shared digital interface that is also situated on a semiconductor substrate as the electronic circuits under test do. In some embodiments for the example illustrated in FIG. 16, the multiple systems for testing electronic circuits 10 may receive identical signals from the test instrument 90.

In these embodiments, the signals 1604, 1608, and 1612 respectively transmitted from the test instrument 90 to the systems for testing electronic circuits 1602, 1606, and 1610 are identical. In some other embodiments, the example illustrated in FIG. 16, the multiple systems for testing electronic circuits 10 may receive different signals from the test instrument 90. In these latter embodiments, at least one portion of a signal of the signals 1604, 1608, and 1612 is different from the other signals during at least a time period within the entire duration of the test. For example, a portion of the signals 1604 transmitted to the system for testing electronic circuits 1602 during a certain time period is different from the signals 1608 and 1612 respectively transmitted to the system for testing electronic circuits 1606 and 1610 during the same period. One or more of these signals 1604, 1608, and 1612 may include a portion of a test signal time-interleaved with a portion of an ideal response signal as described in the preceding paragraphs with reference to FIGS. 14-15. In some embodiments, an electronic circuit 10 may include an interface 18 such as a digital interface described herein. In some embodiments, an interface such as a digital interface 18 may include a demultiplexer such as an demultiplexer 19 that will be described with further details with reference to FIG. 17.

The digital interface 18 may comprise, for example but not limited to, an inter-integrated circuit (I2C), a serial peripheral interface, or any other interfaces (hereinafter digital interface) suitable for interfacing between the test instrument 90 and the system for testing electronic circuits 10. Each system for testing electronic circuits 10 illustrated in FIG. 16 may have its own unique ID which may use, for example, one or more bits to uniquely identify the system for testing electronic circuits 10. For example, the ID may comprise a four-tuple with, for example, identifications of 01, 02, 03, and 04 or 00, 01, 10, 11 in some embodiments. During a test with such an ID, the system for testing electronic circuits 10 may probe four circuits under test at once. Moreover, if there are eight sets of circuits under test to be tested with the four-tuple ID, the system for testing electronic circuits 10 may probe the eight circuits under test in two sets. In some embodiments, the system for testing electronic circuits 10 may further comprises a multiplexer (MUX) or a switch that is disposed between multiple sets of the circuits under test and the system for testing electronic circuits 10 to determine which set the system for testing electronic circuits 10 is reading the signals from.

In various embodiments, the system for testing electronic circuits 10 may comprise an n-tuple ID, wherein n is an integer. In one or more embodiments, a plurality of the system for testing electronic circuits 10 having their own IDs is connected in parallel through a digital interface. A system for testing electronic circuits 10 illustrated in FIG. 16 may receive the test signals and the ideal response signal by using a single physical channel or multiple physical channels. In some embodiments where only one single physical channel is used for a system for testing electronic circuits 10, the test signal and the ideal response signal may be transmitted via the single physical channel in a time interleaved manner as described in the preceding paragraphs with reference to FIGS. 14-15.

One of the advantages of using a single physical channel, rather than multiple physical channels, to transmit the test signals as well as the ideal response signal is that using a single physical channel may result in a simpler system for testing electronic circuits. For example, using a single physical channel may lead to a simplified interface for the system for testing electronic circuits, a fewer number of pins, pads, or terminals, etc. In addition, using a single physical channel to transmit the test signals and the ideal response signals may further increase the efficiency or speed of testing multiple electronic circuits under test. For example, a test equipment 90 having a fixed number of physical channels may accommodate more systems for testing electronic circuits 10 simultaneously when a system for testing electronic circuits needs a fewer number of physical channels to receive test signals and system response signals.

Using a single physical channel to transmit both the test signals and ideal response signal may also reduce the likelihood of electromagnetic interference between the multiple physical channels than using multiple physical channels for a system for testing electronic circuits 10. Some embodiments may also use multiple physical channels to transmit the test signals and system response signals to a system for testing electronic circuits 10. In these embodiments, the system for testing electronic circuits 10 connected in parallel through the digital interface may receive a test signal via one physical channel, and an ideal response signal may be transmitted to the error comparison circuits within the system for testing electronic circuits 10 at substantially the same time via another physical channel. One of ordinary skill in the art will understand that there may exist certain lag in transmission of two signals due to various reasons such as timing delay despite the two signals are intended or designed to be transmitted at exactly the same time.

Figure 17:
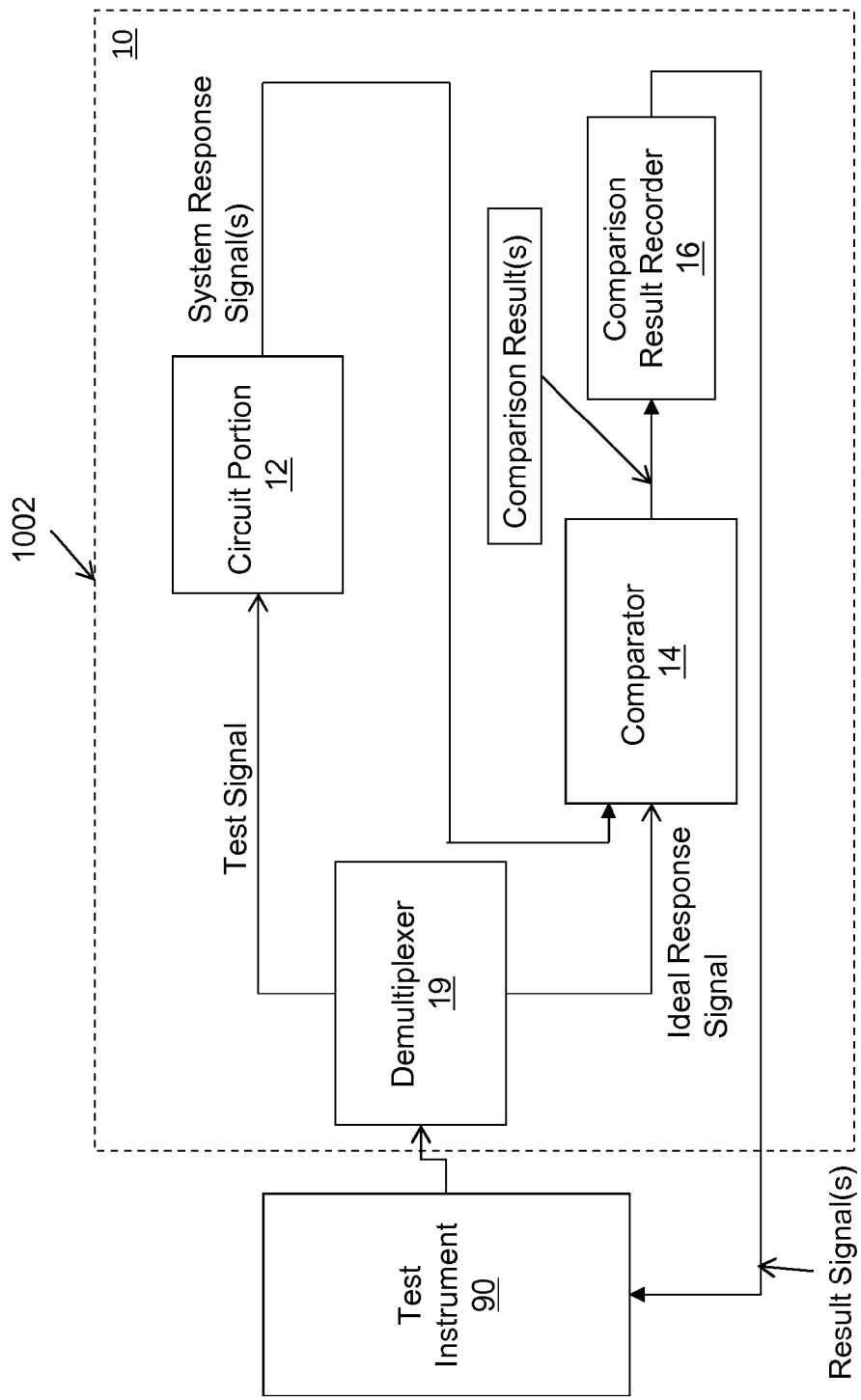
FIG. 17 illustrates an illustrative schematic system block diagram in some embodiments.

FIG. 17 illustrates an illustrative schematic system block diagram for using a system for testing electronic circuits 10 connected to a test instrument 90 via a demultiplexer system or module for testing electronic circuits 10 in the in some embodiments. The illustrative schematic system block diagram of FIG. 17 resembles that of FIGS. 1A-B. More specifically, FIG. 17 shows that the system for testing electronic circuits 10 may be connected to a test instrument 90 via a demultiplexer, a multiplexer having the demultiplexing capabilities, a demultiplexing module including one or more demultiplexers where a port of at least one demultiplexer cascades into another multiplexer or demultiplexer, or any device having the demultiplexing capabilities (hereinafter demultiplexer or demux) 19 such that the test signals and ideal response signals may be transmitted from the test equipment 90 to the system for testing electronic circuit 10 via the demux 19, rather than via a separate physical channel. The demultiplexer 19 may reside at least partially or even entirely on the semiconductor on which the circuit portion under test 12 also resides in some embodiments. For example, in these embodiments where a demultiplexer 19 may include a decoding circuit and multiple logic circuits or switches having a plurality of diodes or transistors, at least a portion of the decoding circuitry or a portion of the multiple logic circuits or switches resides on the semiconductor substrate on which the circuit portion under test 12 also resides.

A multiplexed signal described herein may comprise a single signal or single signal stream (collectively signal) which is combined from multiple signal component parts. A demultiplexer described herein may comprise an electronic device that separates a multiplexed signal into multiple signal component parts and direct the multiple signal component parts to many output lines or channels (collectively channels) in some embodiments. A demultiplexer may be considered as a single-input, multiple-output device in some embodiments. A multiplexed signal described herein may include a single analog, digital signal, or any combination thereof that is combined from more than one signal. A multiplexer may be used to generate a multiplexed signal and may thus be considered as a multiple-input, single-output switch in some embodiments. A demultiplexer described herein may comprise a device that receives a single signal at a single input and selects one of many output lines or channels (collectively channels) connected to the single input and thus may be considered as a single-input, multiple-output switch in some embodiments.

In some embodiments, multiple digital signals, multiple analog signals, or any combinations thereof may be multiplexed into a single signal stream. In these embodiments, the demultiplexer 19 may be used to break up the single signal stream into the original signals. The demultiplexer 19 may use various demultiplexing technologies including, but not limited to, time-division multiplexing (TDM), frequency-division multiplexing (FDM), code-division multiplexing (CDM), orthogonal frequency-division multiplexing, etc. The demultiplexer 19 may thus demultiplex time-division multiplexing (TDM) signals, frequency-division multiplexing (FDM) signals, code-division multiplexing (CDM) signals, orthogonal frequency-division multiplexing signals, etc. from a test instrument (e.g., test instrument 90) in some embodiments.

The multiplexed signals from the test equipment may include at least a portion of test signals interleaved with at least a portion of ideal response signals in one or more re-configurable interleave lengths as described in the preceding paragraphs. In addition to at least a portion of test signals and a portion of ideal response signals, the multiplexed signals from the test equipment may further include the error correction code (e.g., BCH code by Bose, Ray-Chaudhuri, and Hocquenghem, Hamming code, low-density parity-check code, or any other suitable error correction code) or error detection code. In these embodiments where error correction code is imbedded in the signal transmitted from the test equipment to the system 10, the system for testing electronic circuits 10 may further include error correction circuitry and/or error detection circuitry to process the error correction code and the error detection code respectively. As previously described, the signals from external test equipment may also be modulated with various modulation schemes in some embodiments. In these embodiments, the system for testing electronic circuits (e.g., system 10) may further include at least one demodulator to demodulate the modulated signals from the external test equipment.

Using a demux 19 in the system for testing electronic circuits 10 may facilitate the use of a single physical channel to transmit test signals and ideal response signals from the test instrument 90 or to receive test signals and ideal response signals at the system for testing electronic circuits 10. As FIG. 17 illustrates, the system for testing electronic circuits 10 receives both the test signals and the ideal response signals at the demux 19 from test instrument 90. The demultiplexer 19 in turn breaks the single stream of test signals and response signals and transmits the test signals and the ideal response signals to the circuit portion 12 and the comparator 14, respectively. The circuit portion 12 generates the system response signals in response to the test signals and transmits the system response signals to the comparator 14 which compares the system response signals to or with the ideal response signals. The comparator may further forward at least a part of the comparison results to a comparison result recorder 16 in substantially similar manners as described above.

The comparison result recorder 16 may further transmit at least a part of the comparison results to the test instrument 90 in some embodiments. The system for testing electronic circuits 10 may or may not include the circuit portion under test 12, although at least a part of the system 10 resides on a semiconductor substrate on which the circuit portion under test 12 also resides. In other words, the system for testing electronic circuits 10 may comprise the circuit portion under test 12, at least a part of the comparator 14, and at least a part of the comparison result recorder 16 in some embodiments as indicated by the imaginary boundary 1002 that includes the circuit portion 12 from the system for testing electronic circuits 10. In some other embodiments, the system for testing electronic circuits 10 may comprise at least a portion of the comparator 14 and at least a portion of the comparison recorder 16 but not the circuit portion under test 12 as indicated by the imaginary boundary 1002 that excludes the circuit portion 12 from the system for testing electronic circuits 10.

In some embodiments including a demux 19, at least a portion of the test signal and a portion of the ideal response signal may be multiplexed into a single signal stream that is further received at the demux 19. In this manner, a system for testing electronic circuits 10 may need only a single physical channel to receive both the portion of the test signals and the portion of the ideal response signals, and fewer test pins, pads, or terminals may be required for the testing. In addition or in the alternative, fewer test channels may be needed at the test equipment (e.g., test equipment 90) for testing each circuit portion under test (e.g., circuit portion 12 in FIG. 17). As a result, electromagnetic interferences between the physical channels transmitting the test signals and ideal response signals to the system 10 may be reduced, and the integrity of the signals may be improved due to the fewer physical channels required. Another advantage is that testing multiple circuit portions (e.g., circuit portion 12) or more circuit portions in parallel may be realized due to the need for fewer physical channels required and/or reduced electromagnetic interferences, even for the same test equipment.

Figure 18:
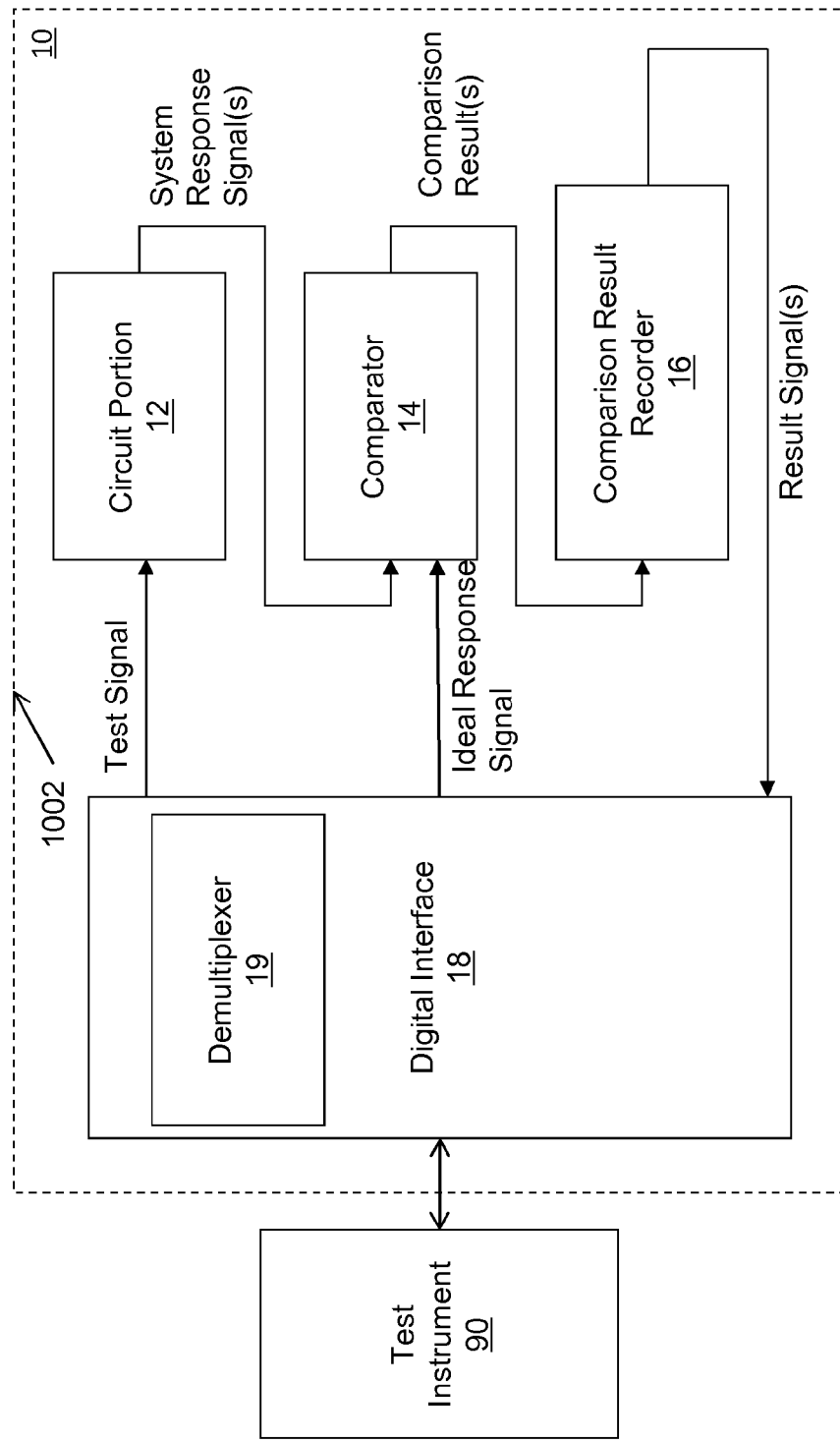
FIG. 18 illustrates an illustrative system block diagram including the system for testing an electronic circuit 10 connected to a test instrument 90 through a digital interface 18 of the system for testing an electronic circuit 10 in some embodiments.

FIG. 18 illustrates an illustrative system block diagram including the system for testing an electronic circuit 10 connected to a test instrument 90 through a digital interfaces 18 of the system for testing an electronic circuit 10 in some embodiments. FIG. 18 illustrates a schematic block diagram where an interface (e.g., digital interface 18) of the system for testing electronic circuits 10 receives test signals and ideal response signals from test equipment 90. At least a portion of the test signals and at least a portion of ideal response signals may be multiplexed into a single signal stream. In some of these embodiments, the portion of the test signals and the portion of the ideal response signal may be time interleaved with one or more re-configurable interleave lengths. The interface 18 may include a demultiplexer to break the single signal stream into test signal portion and ideal response signal portion.

The interface 18 may then forward the test signal portion and the ideal response signal portion to the circuit portion under test 12 and the comparator 14, respectively. The circuit portion 12 may generate corresponding system response signals in response to the test signal portion and transmit the system response signals to the comparator 14 to be compared with the ideal response signal portion sent from the interface 18. The comparator 14 may generate and transmit the comparison results to the comparison result recorder 16. The comparison result recorder 16 may in turn transmit at least a portion of the comparison results (e.g., the portion indicating errors or success of the tests and/or any other information such as the signals, information about the circuit portion, etc. related to the errors or success) back to the interface 18, which may in turn transmit the received portion of the comparison result to the test instrument 90.

The system for testing electronic circuits 10 may or may not include the circuit portion under test 12, although at least a part of the system 10 resides on a semiconductor substrate on which the circuit portion under test 12 also resides. In other words, the system for testing electronic circuits 10 may comprise the circuit portion under test 12, at least a part of the comparator 14, and at least a part of the comparison result recorder 16 in some embodiments as indicated by the imaginary boundary 1002 that includes the circuit portion 12 from the system for testing electronic circuits 10. In some other embodiments, the system for testing electronic circuits 10 may comprise at least a portion of the comparator 14 and at least a portion of the comparison recorder 16 but not the circuit portion under test 12 as indicated by the imaginary boundary 1002 that excludes the circuit portion 12 from the system for testing electronic circuits 10.

In the embodiments illustrated in FIGS. 17-18, the circuit portion 12 in system 10 resides on a semiconductor substrate. Each of the other components or modules (e.g., the demultiplexer 19, the comparator 14, and the comparison result recorder 16) may reside partially or wholly on the semiconductor substrate together with the electronic circuit portion 12 in some embodiments. In some other embodiments, each of the other components or modules (e.g., the demultiplexer 19, the comparator 14, and the comparison result recorder 16) may reside may reside completely off the semiconductor substrate on which the electronic circuit portion resides. In addition or in the alternative, the circuit portion 12 resides on a semiconductor substrate. Each of the other components or modules (e.g., the demultiplexer 19, the digital interface 18, the comparator 14, and the comparison result recorder 16) may partially or wholly reside on the same semiconductor substrate together with the electronic circuit portion 12 or may reside completely off the semiconductor substrate.

Figure 19:
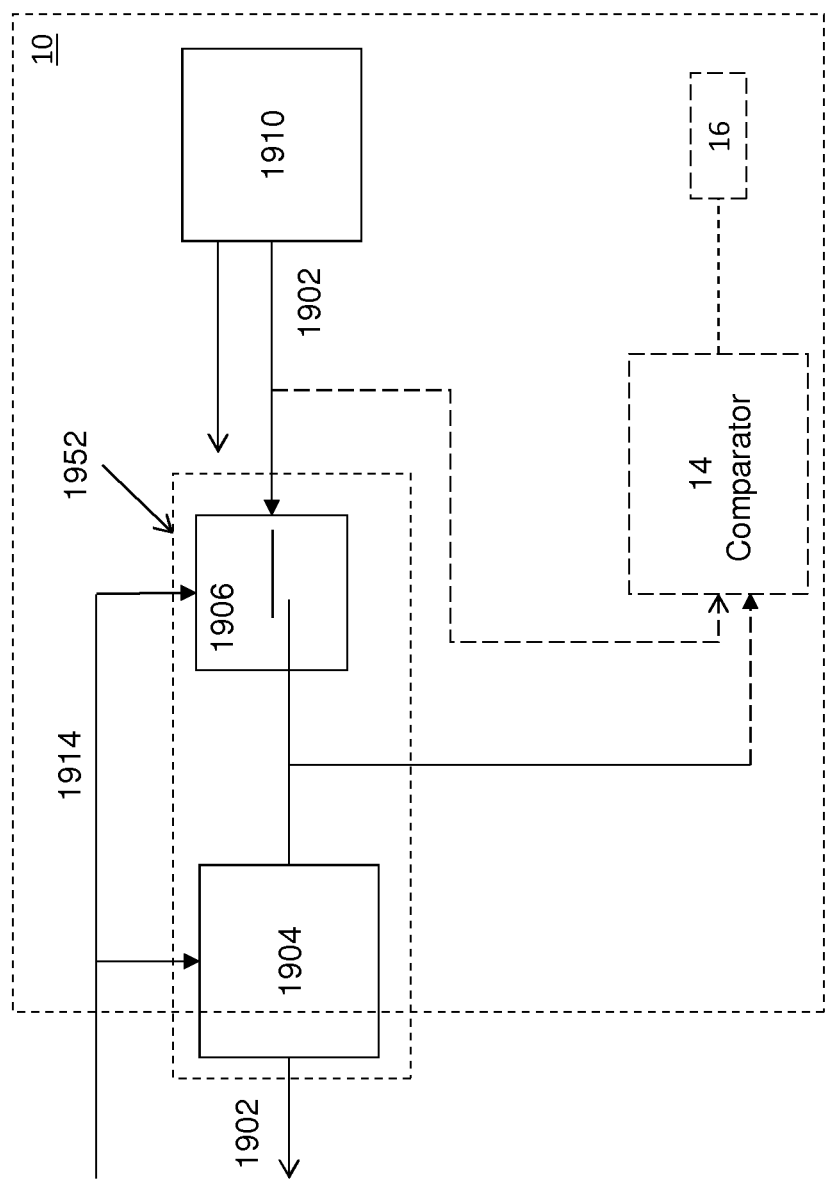
FIG. 19 illustrates a partial view of a system schematic diagram for a system for testing an electronic circuit portion during normal operations of the electronic circuit portion in some embodiments.

FIG. 19 illustrates a partial view of a system schematic diagram for a system for testing an electronic circuit portion during normal operations of the electronic circuit portion in some embodiments. In these embodiments illustrated in FIG. 19, the system 10 for testing the electronic circuit portion 1910 situated on a semiconductor substrate comprises one or more input/output ports 1904 and a switch, a multiplexer, a functional block, a logic circuit having a tri-state output, or an input/output port that has the functionality to interrupt or divert an electrical current or signal (collectively electrical current) from one conductor to another, or any electronic component or module that may interrupt or divert the electrical current from one conductor to another (collectively a switch or a switching circuitry).

In some embodiments, at least one input/output port 1904 is configurable or reconfigurable to perform as an output port to transmit, for example, at least one output signal 1902 generated by the electronic circuit portion 1910 in response to input signal(s) during the normal operations of the electronic circuit portion 1910 and to perform as an input port to receive, for example, at least a portion of the ideal response signals 2002 into the comparator 14 during testing of the electronic circuit portion 1910. The at least one input/output port 1904 may be configured dynamically to act as an input portion or an output port by using one or more control signals 1914 sent from a source (e.g., from an external test equipment situated externally to the system 10 during testing, from an external input signal source during normal operations of the electronic circuit portion 1910, or from the circuit portion 1910 in response to one or more signals from, for example, the external test equipment).

A port such as the input/output port 1904 may collectively refer to, for example but not limited to as simple as a conductor such as a pin, a terminal, or a pad in some embodiments. For example, the input/output port 1904 may simply include a conductor functioning in conjunction with a switch described above to control the data flow direction through the input/output port 1904. A port such as the input/output port 1904 may also include one or more circuit components or registers (e.g., data direction register, port register(s), control register(s), etc.) in some other embodiments. For example, an input/output port 1904 may include one or more tri-state (e.g., low, high, and high-impedance) circuit components (e.g., a tri-state buffer or tri-state inverter) that configure and hence determine the data flow direction through the input/output port 1904 in some embodiments. In these embodiments, the one or more tri-state circuit components may function as a switch to configure the input/output port 1904 as an input port or an output port, as needed or desired. The switch or the switch circuitry (e.g., the switch 1906) may also be included, at least in part, in an input/output port 1904 such that the input/output port itself has the switching capabilities to change the data flow direction through the input/output port 1904 in some embodiments. The input/output port 1904 may also include one or more port registers to allow the one or more pins of the input/output port 1904 to be accessed in some of these embodiments. The input/output port 1904 may further optionally include one or more port data latches or registers to hold data written to the one or more pins of the input/output port 1904 in some of these embodiments.

The switch 1906 is devised to receive the control signal 1914 to close during the normal operations of the electronic circuit portion 1910 such that the output of the electronic circuit portion 1910 may be transmitted from the electronic circuit portion 1910 through the switch 1906 and then the output port 1904 configured from the input/output port 1904 by, for example, a control signal. The switch 1906 is devised to receive the control signal 1914 to open during testing of the electronic circuit portion 1910 such that the system 10 may receive, for example, at least a portion of the ideal response signals that will be transmitted from, for example, an external test equipment through the input port 1904 to the comparator 14 as illustrated in FIG. 20.

More details about configuring the at least one input/output ports 1904 as an input port will be described in the following paragraphs with reference to FIG. 20. During normal operations to perform the intended functions of the electronic circuit portion 1910, the comparator module 14 and the comparison result recording module 16 in the system 10 may be disabled or idle in some embodiments. In these embodiments, the electronic circuit portion 1910 may send its normal output signals 1902 to the at least one output port 1904 via the switch 1906, which has been configured to close via, for example, the control signal 1914. The switch 1906 may be situated on the semiconductor substrate on which the electronic circuit portion 1910 is also situated in some of these embodiments and may be used to control which data path the normal output signals of the electronic circuit portion 1910 may use.

It shall be noted that the dashed boundary 10 indicates which portion of the system 10 may be situated on the semiconductor substrate on which the electronic circuit portion 1910 also resides. For example, the switch 1906 and the input/output port 1904 may also reside on the semiconductor substrate (e.g., on-die) together with the electronic circuit portion 1910. The comparator 14 or the comparison result recording module 16, on the other hand, may be partially or completely situated on the semiconductor substrate in some of these embodiments. In some other embodiments, the comparator 14 and the comparison result recording module 16 may be situated completely external to the semiconductor substrate. Moreover, the dashed boundary 1952 indicates that the switch 1906 and the input/output port 1906 may constitute two separate electrical components in some embodiments or a single electrical component (e.g., an input/output port having the functionality to interrupt or divert the electrical current from one conductor to another conductor) in some other embodiments. In these latter embodiments, the input/output port 1904 and the switch 1906 belong to a single electrical component such as an input/output port having the capability to interrupt or divert the electrical current from one conductor to another conductor as indicated by the dashed boundary 1952.

FIG. 20 illustrates a partial view of a system schematic diagram for a system 10 for testing an electronic circuit portion while the electronic circuit portion is under test in some embodiments. In these embodiments, the system receives test signals and ideal response signals to test the electronic circuit portion 1910 on a semiconductor substrate. Moreover, the control signal 1914 is used to open the switch 1906 and to configure at least one input/output port of one or more input/output ports 1904 into an input port to receive, for example, at least a portion of the ideal response signal 2002 from, for example, an external test equipment situated externally to the semiconductor substrate on which the electronic circuit portion under test 1910 is also situated.

Because the control signal 1914 opens the switch 1906, the at least a portion of the ideal response signals 2002 is directed to the comparator 14, which compares the at least a portion of the ideal response signal to the corresponding system response signals 1908 generated by the electronic circuit portion under test 1910 in response to some test signals transmitted from an external test equipment (not shown). The comparator 14 may then forward at least a part of the comparison results 1912 to the comparison result recording module 16 during testing of the electronic circuit portion under test 1910. It shall be noted that the use of at least one output port (for normal operations of the electronic circuit) as an input port to transmit at least a portion of an ideal response signal does not preclude the use of one or more other input ports to transmit the remainder of the ideal response signal(s) to the electronic circuit.

It shall be also noted that the dashed boundary 10 indicates which portion of the system 10 may be situated on the semiconductor substrate on which the electronic circuit portion 1910 also resides. For example, the switch 1906 and the input/output port 1904 may also reside on the semiconductor substrate (e.g., on-die) together with the electronic circuit portion 1910. The comparator 14 or the comparison result recording module 16, on the other hand, may be partially or completely situated on the semiconductor substrate in some of these embodiments. In some other embodiments, the comparator 14 and the comparison result recording module 16 may be situated completely external to the semiconductor substrate.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense. Moreover, unless otherwise explicitly stated, various processes need not be performed in order to achieve the intended purpose(s) in the order as they are described in the foregoing specification. Similarly, unless otherwise explicitly stated, various modules or parts of the system need not be invoked in the order they are described in the foregoing specification in order to achieve the intended purpose(s).

What is claimed is:

1. An apparatus for testing an electronic circuit, comprising:
   a demultiplexing circuitry that is to receive at least a multiplexed signal stream from a test equipment as an input to the apparatus to test the electronic circuit on a semiconductor substrate, wherein
      the multiplexed signal stream is obtained by multiplexing at least a portion of a test signal and at least a portion of an ideal response signal, and
      the test equipment is situated external to the semiconductor substrate on which the electronic circuit is located;
   a comparison module which is to compare a system response signal with the at least the portion of the ideal response signal, wherein
      at least a part of the comparison module is located on the semiconductor substrate on which the electronic circuit to be tested is located; and
   a recording module which is to store a comparison result in a non-transitory computer or machine readable storage medium, wherein an interface is devised to transmit the test signal from the test equipment to the electronic circuit on the semiconductor substrate and to transmit the ideal response signal and comparison results between the test equipment and the comparison module, 2. The apparatus of claim 1, further comprising:
a first electronic circuitry which is to output a system response signal in response to the at least the portion of the test signal and is operatively connected to at least one of the comparison module and the recording module, wherein the multiplexed signal stream further comprises error correction code or error detection code.

3. The apparatus of claim 1, further comprising:
an interface which is to perform at least one of
receiving the multiplexed signal stream from the test equipment to the electronic circuit,
demultiplexing the multiplexed signal stream back into the at least the portion of the test signal and the at least the portion of the ideal response signal using the demultiplexing circuitry, or
receiving the comparison result from the recording module.

4. The apparatus of claim 1, wherein at least a part of the comparison module or the recording module is located on the semiconductor substrate on which the electronic circuit is situated.

5. The apparatus of claim 1, wherein the apparatus is to receive entire test signals and entire ideal response signals via only a single physical channel, rather than via more than one physical channel, from the test equipment.

6. The apparatus of claim 1, wherein the demultiplexing circuitry is to receive the multiplexed signal stream in a time interleaved manner during at least a time period that is shorter than entire duration of testing the electronic circuit on the semiconductor substrate.

7. The apparatus of claim 1, wherein
the demultiplexing circuitry is to receive the multiplexing signal stream including a series of repeating patterns of signals during at least a time period shorter than entire duration for testing the electronic circuit on the semiconductor substrate, and
a pattern in the series of repeating patterns includes a part of the at least the portion of the test signal having a first interleave length that is time interleaved with and followed by a part of the at least the portion of the ideal response signal having a second interleave length in the pattern.

8. The apparatus of claim 7, wherein the first interleave length of the part of the at least the portion of the test signal is identical to or different from the second interleave length of the part of the at least the portion of the ideal response signal.

9. The apparatus of claim 7, wherein the pattern in the series of repeating patterns includes another part of the at least the portion of the test signal or another part of the at least the portion of the ideal response signal that has a third interleave length and follows the part of the at least the portion of the ideal response signal having the second interleave length.

10. The apparatus of claim 1, further comprising:
a first physical channel that is operatively connected to the demultiplexing circuitry to receive the multiplexing signal stream; and
a second physical channel that is to transmit at least another portion of the test signal or another portion of the ideal response signal from the test equipment as another input to test the electronic circuit.

11. The apparatus of claim 1, wherein
the demultiplexing circuitry in the apparatus receives the at least the portion of the ideal response signal based at least in part upon an occurrence of a first rising edge or a first falling edge of at least a portion of a clock signal,
the demultiplexing circuitry in the apparatus receives the at least the portion of the test signal based at least in part upon a second rising edge or a second falling edge of the at least the portion of the clock signal,
the first rising edge is same as or different from the second rising edge, and
the first falling edge is same as or different from the second falling edge.

12. A method for testing an electronic circuit, comprising:
initializing a system for testing an electronic circuit;
causing the system to receive or receiving, by using a demultiplexing circuitry in the system, at least a multiplexed signal stream comprising at least a portion of a test signal and at least a portion of an ideal response signal from a test equipment to test the electronic circuit on a semiconductor substrate, wherein
the system does not include the test equipment from which the demultiplexing circuitry of the system is to receive the test signal, and
causing to compare or comparing, by using a comparison circuitry, the at least the portion of the ideal response signal in the multiplexed signal stream with a system response signal that is generated by the electronic circuit in response to the at least the portion of the test signal; and
causing to record or recording a comparison result of the act of causing to compare or comparing in a computer or machine readable storage medium, wherein the demultiplexing circuitry is to transmit the multiplexed signal stream and the comparison result between the test equipment and the comparison circuitry.

13. The method of claim 12, wherein
the demultiplexing circuitry is to receive the multiplexed signal stream via a single physical channel, rather than via more than one physical channel, and
the demultiplexing circuitry is to receive the multiplexed signal stream in a time interleaved manner during at least a time period that is shorter than entire duration of testing the electronic circuit on the semiconductor substrate.

14. The method of claim 12, further comprising:
receiving the multiplexed signal stream to a plurality of systems for testing electronic circuits substantially simultaneously.

15. The method of claim 12, further comprising:
receiving the multiplexed signal stream that includes a series of repeating patterns of signals during at least a time period shorter than entire duration for testing the electronic circuit on the semiconductor substrate, wherein
a pattern in the series of repeating patterns includes a part of the at least the portion of the test signal having a first interleave length that is time interleaved with and followed by a part of the at least the portion of the ideal response signal having a second interleave length in the pattern.

16. The method of claim 15, wherein the first interleave length of the part of the at least the portion of the test signal is identical to or different from the second interleave length of the part of the at least the portion of the ideal response signal.

17. The method of claim 15, further comprising:
configuring the pattern to alter the first interleave length into a third interleave length or the second interleave length into a fourth interleave length in the pattern; and
modifying the multiplexed signal stream to include signals having the third interleave length or the fourth interleave length.

18. An apparatus for testing an electronic circuit on a semiconductor substrate, comprising:

an electronic circuit residing on the semiconductor substrate;

a switching circuitry that is controlled by a control signal;

an input/output port, which is operatively connected to the switching circuitry, that is controlled by the control signal or the switching circuitry to cause the input/output port to function as either an input port or an output port, wherein when the apparatus undergoes normal operations of the electronic circuit, the control signal or the switching circuitry causes the input output port to act as the output port to transmit at least one output signal of the electronic circuit, when the apparatus undergoes testing of the electronic circuit, the control signal or the switching circuitry causes the input/output port to act as the input port to receive at least a portion of an ideal response signal from test equipment, the test equipment transmits a test signal to the electronic circuit for the testing and is situated external to the semiconductor substrate on which the electronic circuit is located, and;

the input/output port comprises one or more circuit components that are used to determine a flow detection through the input/output pot and is situated on the semiconductor substrate and external to the test equipment;

a comparison module which is to compare a system response signal generated in response to the test: signal with the at least the portion of the ideal response signal, wherein at least a part of the comparison module is located on the semiconductor substrate on which the electronic circuit to be tested is located; and a recording module which is to store comparison result in a non-transitory computer or machine readable storage medium.

19. The apparatus of claim 18, wherein the control signal is generated by the electronic circuit in response to one or more signals from the test equipment.

20. The apparatus of claim 18, wherein the input/output port comprises switching functionality and includes the switching circuitry so that the switching circuitry is a part of the input/output port.

* * * * *